US009862844B2

(12) United States Patent
Agrawal et al.

(10) Patent No.: US 9,862,844 B2
(45) Date of Patent: Jan. 9, 2018

(54) HOMOGENEOUS PRECURSOR FORMATION METHOD AND DEVICE THEREOF

(71) Applicant: PURDUE RESEARCH FOUNDATION, West Lafayette, IN (US)

(72) Inventors: Rakesh Agrawal, West Lafayette, IN (US); Ruihong Zhang, West Lafayette, IN (US); Bryce Chryst Walker, Hillsboro, OR (US); Carol Handwerker, West Lafayette, IN (US)

(73) Assignee: PURDUE RESEARCH FOUNDATION, West Lafayette, IN (US)

( * ) Notice: Subject to any disclaimer, the term of this patent is extended or adjusted under 35 U.S.C. 154(b) by 0 days.

(21) Appl. No.: 15/219,450

(22) Filed: Jul. 26, 2016

(65) Prior Publication Data
US 2016/0333200 A1    Nov. 17, 2016

Related U.S. Application Data

(63) Continuation of application No. 14/824,913, filed on Aug. 12, 2015, now Pat. No. 9,738,799.
(Continued)

(51) Int. Cl.
*B05D 5/12*       (2006.01)
*C09D 7/12*       (2006.01)
(Continued)

(52) U.S. Cl.
CPC .......... *C09D 7/1233* (2013.01); *C01B 19/002* (2013.01); *H01L 21/0256* (2013.01);
(Continued)

(58) Field of Classification Search
CPC combination set(s) only.
See application file for complete search history.

(56) References Cited

U.S. PATENT DOCUMENTS

2009/0291236 A1* 11/2009 Sasada ................. B22F 1/0059
                                                    428/1.1
2012/0067407 A1*  3/2012 Fujdala ........... H01L 31/022425
                                                    136/252
(Continued)

OTHER PUBLICATIONS

Yuan et al. "Solvent properties of hydrazine in the preparation of metal chalcogenide bulk materials and films" (Apr. 2009).*

*Primary Examiner* — Austin Murata
(74) *Attorney, Agent, or Firm* — Purdue Research Foundation; Zhigang Rao

(57) ABSTRACT

A direct solution method based on a versatile amine-thiol solvent mixture which dissolves elemental metals, metal salts, organometallic complexes, metal chalcogenides, and metal oxides is described. The metal containing and metal chalcogenide precursors can be prepared by dissolving single or multiple metal sources, chalcogens, and/or metal chalcogenide compounds separately, simultaneously, or stepwise. Multinary metal chalcogenides containing at least one of copper, zinc, tin, indium, gallium, cadmium, germanium, and lead, with at least one of sulfur, selenium, or both are obtained from the above-mentioned metal chalcogenide precursors in the form of thin films, nanoparticles, inks, etc. Furthermore, infiltration of metal containing compounds into a porous structure can be achieved using the amine-thiol based precursors. In addition, due to the appreciable solubility of metal sources, metal chalcogenides, and metal oxides in the mixture of amine(s) and thiol(s), this solvent mixture can be used to remove these materials from a system.

15 Claims, 15 Drawing Sheets

Related U.S. Application Data

(60) Provisional application No. 62/036,233, filed on Aug. 12, 2014.

(51) Int. Cl.
    *C01B 19/00*     (2006.01)
    *H01L 21/02*     (2006.01)
    *H01L 31/032*     (2006.01)
    *H01L 31/072*     (2012.01)
    *H01L 31/18*     (2006.01)

(52) U.S. Cl.
    CPC .. *H01L 21/02557* (2013.01); *H01L 21/02568* (2013.01); *H01L 21/02601* (2013.01); *H01L 21/02628* (2013.01); *H01L 31/0326* (2013.01); *H01L 31/072* (2013.01); *H01L 31/1864* (2013.01); *Y02E 10/50* (2013.01)

(56) References Cited

U.S. PATENT DOCUMENTS

2012/0232206 A1*   9/2012   Wu ................... C09D 7/001
                                                524/440
2015/0076494 A1*   3/2015   Pickett ............. H01L 21/02565
                                                257/43

* cited by examiner

HOMOGENEOUS PRECURSOR FORMATION METHOD AND DEVICE THEREOF

CROSS-REFERENCE TO RELATED APPLICATIONS

The present patent application is a continuation application of U.S. Non-provisional patent application Ser. No. 14/824,913, filed on Aug. 12, 2015, which is related to and claims the priority benefit of U.S. Provisional Patent Application Ser. No. 62/036,233, filed Aug. 12, 2014, the contents of which is hereby incorporated by reference in its entirety into this disclosure.

STATEMENT OF GOVERNMENT INTEREST

This invention was made with government support under DGE-0903670 awarded by the National Science Foundation. The government has certain rights in the invention.

TECHNICAL FIELD

The present disclosure generally relates to a direct solution method based on amine-thiol mixtures for depositing inorganic films and synthesizing inorganic nanoparticles, and in particular to multinary metal chalcogenides containing at least one of copper (Cu), zinc (Zn), tin (Sn), indium (In), gallium (Ga), cadmium (Cd), germanium (Ge), and lead (Pb) and at least one of sulfur (S), selenium (Se) or both.

BACKGROUND

This section introduces aspects that may help facilitate a better understanding of the disclosure. Accordingly, these statements are to be read in this light and are not to be understood as admissions about what is or is not prior art.

Solution deposition of semiconducting materials has become increasingly attractive because it offers a number of advantages over vacuum deposition in terms of factors including low capital cost in raw materials and equipment, high-throughput production, and better compatibility with flexible or polymeric substrates. Molecular precursors with desired elements mixed on a molecular scale have been actively studied in the deposition of semiconducting materials, especially metal chalcogenides, for thin film transistors (TFTs), solar cells, thermoelectrics, and phase change memory applications. The molecular-level homogeneity enables the precise control of stoichiometry and the enhanced spatial uniformity in as-deposited films, and in turn an improved device performance. However, the negligible solubility of metal and chalcogen sources in many solvents hampers the development of this solution method. In 2004, the hydrazine-based solution was first used by IBM Watson Research Center to dissolve $SnS_2$, yielding a molecular precursor for the active layer in TFTs. This hydrazine-based precursor was successfully extended to the fabrication of $CuIn(S,Se)_2$, $Cu(In,Ga)(S,Se)_2$, and $Cu_2ZnSn(S,Se)_4$ thin films. With a hydrazine-based slurry, a record power conversion efficiency for kesterite $Cu_2ZnSn(S,Se)_4$ solar cells was achieved at 12.6%. In order to incorporate the insoluble zinc into the hydrazine-based solution, hydrazinocarboxylic acid was introduced into hydrazine resulting in a solar cell efficiency of 8.08%.

Despite the efficacy of using hydrazine, it is highly explosive, toxic, and carcinogenic, and thus various handling limitations are required during the film preparation. Aiming to replace hydrazine, several trials using other solvents and S or Se sources have been conducted. For example, a thiourea-stabilized precursor was used in the studies of Zeng et al., Hao et al., and Si-Nae Park et al. Unfortunately, the films produced using that precursor are either porous or with a substantial residual fine grain layer which limits the further improvement in the cell performance. In another recent study, copper (I) oxide was dissolved in a mixture of 1-butylamine, carbon disulfide, and thioglycolic acid while zinc oxide and tin oxide were separately dissolved in a mixture of 1-butylamine and carbon disulfide. These three solutions were mixed together to get a CZTS precursor before deposition on the substrates. Although a solar cell efficiency of 6.03% was achieved, the dissolution involves heat treatment and the multi-step precursor preparation is relatively complicated. Furthermore, the solvents used in the above molecular precursors are limited to the deposition of a few metal chalcogenides and thus it is very difficult to extend this precursor method to other metal chalcogenide systems.

There is therefore an unmet need for a novel molecular precursor solution and method for depositing inorganic films and synthesizing inorganic nanoparticles.

SUMMARY

In one aspect, a method of dissolving at least one metal source is presented. The method includes the step of contacting a starting material with a mixture of at least one amine and at least one thiol. The starting material can be at least one an elemental metal, a metal alloy, a metal salt, and/or an organometallic complex. The elemental metal can be at least one of Cu, Zn, Sn, and/or Cd, and the metal alloy comprises at least two elemental metals of Cu, Zn, Sn, and Cd. The amine is a primary, secondary, tertiary amine, and/or polyamine, and the carbon chain ranges from C2 to C24. The thiol has the structure of R5-SH and/or HS-R6-SH, with the carbon chain ranging in size from C2 to C16; R5 represents any alkyl, aryl group, alcohol group —R'OH (R'=alkyl), and/or carboxylic acid group —R"COOH (R"=alkyl and/or aryl), and R6 represents an alkyl and/or aryl group.

In another aspect, a method of dissolving metal chalcogenide(s) is presented. The method includes the step of contacting a metal chalcogenide with a mixture, the mixture comprising amine and dithiol. The metal chalcogenide contains at least one of Cu, Zn, Sn, In, Ga, Cd, Ge, and Pb, and at least one of S and Se. The amine contains a primary, secondary, tertiary amine, and/or polyamine, the amine's carbon chain ranges from C2 to C24. The dithiol has the structure of HS-R6-SH; R6 represents an alkyl and/or aryl group. The mixture comprises of a primary amine and a dithiol. The amine comprises a primary, secondary, tertiary amine, and/or polyamine, and the amine carbon chain ranges from C2 to C24. The thiol has the structure of R5-SH and HS-R6-SH with a carbon chain ranging in size from C2 to C16; R5 represents an alkyl, aryl group, alcohol group —R'OH (R'=alkyl), and/or carboxylic acid group —R"COOH (R"=alkyl and/or aryl), and R6 represents an alkyl and/or aryl group.

In another aspect, a method of preparing a metal chalcogenide precursor is presented. The method includes the step of contacting at least one elemental metal, metal alloy, metal salt, organometallic complex, and/or metal chalcogenide, and at least one chalcogen with a mixture of amine and thiol.

In yet another aspect, a method of preparing a metal chalcogenide precursor is presented. The method includes the step of mixing at least one metal chalcogenide solutions.

The at least one metal chalcogenide solutions are prepared by contacting a metal chalcogenide with a mixture, the mixture comprising amine and dithiol, wherein the metal chalcogenide comprises at least one of Cu, Zn, Sn, In, Ga, Cd, Ge, and Pb, and at least one of S and Se. The amine can contain a primary, secondary, tertiary amine, and/or polyamine. The amine's carbon chain ranges from C2 to C24 and the dithiol has the structure of HS-R6-SH and R6 represents an alkyl and/or aryl group.

In yet another aspect, a method of depositing a thin film on a substrate with a precursor is described. The deposition of the thin film includes the steps of preparing the precursor, applying the precursor on a substrate using a printing/coating technique, and performing proper heat treatment under a suitable condition to form a thin film. The thin film can be at least one of CuS, CuSe, $Cu_2S$, $Cu_2Se$, SnS, SnSe, ZnS, ZnSe, $SnS_2$, $SnSe_2$, $In_2S_3$, $In_2Se_3$, $CuInS_2$, $CuInSe_2$, CdS, CdSe, PbS, PbSe, $CuInS_2$, $CuInSe_2$, $Cu_2SnS_3$, $Cu_2SnSe_3$, $Cu_x(In_{1-y}Ga_y)(S_{1-z}Se_z)_{2+q}$ ($0 \leq x \leq 1$, $0 \leq y \leq 1$, $0 \leq z \leq 1$, and $-1 \leq q \leq 1$), and $Cu_{2-x}Zn_{1+y}Sn(S_{1-z}Se_z)_{4+q}$ ($0 \leq x \leq 1$, $0 \leq y \leq 1$, $0 \leq z \leq 1$, and $-1 \leq q \leq 1$).

In yet another aspect, a method of depositing a $Cu_2ZnSn(S,Se)_4$ film containing a compound formula $Cu_{2-x}Zn_{1+y}Sn(S_{1-z}Se_z)_{4+q}$, wherein $0 \leq x \leq 1$, $0 \leq y \leq 1$, $0 \leq z \leq 1$, and $-1 \leq q \leq 1$ is presented. The preparation of the solution includes the steps of dissolving a source of Cu, a source of Zn, a source of Sn in an amine-thiol mixture to form solution A, dissolving a source of at least one of S and Se in an amine-thiol mixture to form solution B, combining solution A and solution B at sufficient conditions to form a stable precursor, applying the above precursor on a substrate with certain techniques to form a $Cu_{2-x}Zn_{1+y}Sn(S_{1-z}Se_z)_{4+q}$ thin film, performing proper drying processes and heat treatment, and fabricating photovoltaic devices using the resulting thin film. The amine is a primary, secondary, tertiary amine, and/or polyamine, and the amine carbon chain ranges from C2 to C24. The thiol can have the structure of R5-SH and/or HS-R6-SH, with a carbon chain ranging in size from C2 to C16; R5 represents any alkyl, aryl group, alcohol group —R'OH (R'=alkyl), and/or carboxylic acid group —R"COOH (R"=alkyl and/or aryl), and R6 represents any alkyl and/or aryl group. The the Zn source is elemental Zn and the thiol can contain at least one dithiol.

BRIEF DESCRIPTION OF THE FIGURES

FIG. 4a shows Zn metal dissolved in butylamine and propanethiol (vol 1:1) mixture; the solution is transparent without precipitates.

FIG. 4b shows $Cu_2O$ dissolved in butylamine and propanethiol (vol 1:1) mixture; the solution is transparent yellow without precipitates.

FIG. 4c shows CuS in butylamine and 1,2-ethanedithiol (vol 1:1) mixture; the solution is transparent brown without precipitates.

FIG. 5a shows Solution A, which contains CuCl, $ZnCl_2$, and $SnCl_2$ (abbreviated into CZT in FIG. 5a) in hexylamine and propanethiol, and the solution is transparent yellow without precipitates.

FIG. 5b shows Solution B, which contains S and Se in hexylamine and propanethiol, and the solution is dark red without precipitates;

FIG. 5c shows a CZTSSe solution precursor containing CuCl, $ZnCl_2$, $SnCl_2$, S, and Se with S:Se ratio as 6:1.

FIG. 5d shows a CZTSSe solution precursor containing S:Se ratio as 4:1; the CZTSSe solutions depicted in FIGS. 5c and 5d are obtained by mixing solution A and solution B (FIGS. 5a and 5b, respectively); the solution in FIG. 5c is transparent orange, whereas the solution in FIG. 5d is transparent red.

DETAILED DESCRIPTION

Figure 1:
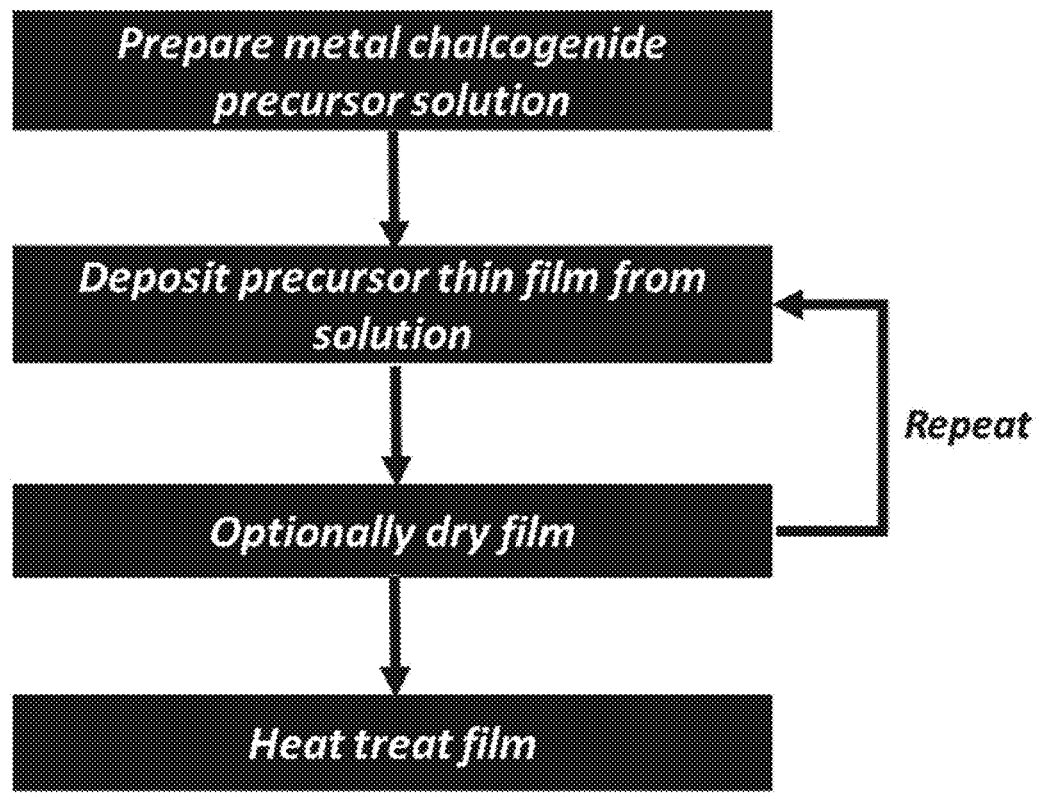
FIG. 1 illustrates the primary steps in metal chalcogenide thin film preparation.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure, the molecular precursors are obtained based on a versatile mixture of amine and thiol. This solvent mixture has the demonstrated efficacy in dissolving many metal and chalcogen sources at appreciable concentrations at room temperature. Multinary metal chalcogenide thin films have been deposited using the molecular precursors containing at least one of Cu, Zn, Sn, In, Ga, Cd, Ge, and Pb and at least one of S and Se. Kesterite CZTSSe solar cells have been fabricated using this precursor method and a power conversion efficiency of 6.78% has been achieved. In addition, this amine-thiol based method can be used in the deposition of other inorganic thin films (e.g. metal alloys and oxides), the synthesis of nanoparticles and nanoparticle inks, the infiltration of inorganic materials into porous structures, and the selective etching of materials.

Definitions:

In order to provide a clear and consistent understanding of the specification and claims, the following definitions are provided.

As used herein, the term "metal" means elements of s, d, f-block as well as elements in group 13 and group 14 of p-block in the periodic table. Herein, elements in s-block include all alkali and alkaline earth metals metals, such as sodium, magnesium, etc.; elements in d-block include all transition metals, such as copper, zinc, etc.; elements in f-block include all lanthanoids and actinoids, such as cerium, actinium, etc.; elements in group 13 in p-block include aluminum, gallium, indium, thallium, etc.; elements in group 14 in p-block include silicon, germanium, tin, lead, etc.

As used herein, the term "metal sources" refers to at least one of elemental metals, metal alloys, metal salts, and organometallic complexes, whereby the term "metal" refers to the definition above. Examples of elemental metals can be, but not limited to, Cu, Zn, In, Ga, Ge, Cd, and Pb. Examples of metal alloys can be, but not limited to, Cu—Zn, Cu—Sn, and Zn—Sn alloys. Examples of metal salts can include metal halides (e.g. chlorides, bromides, and iodides), metal acetates, metal sulfates, and metal nitrates. Examples of metal organometallic complexes can be, but not limited to, copper acetylacetonate, tin bis(acetylacetonate) dibromide, and gallium acetylacetonate. A source of copper, for example, can refer to elemental Cu, Cu—Zn alloy, copper (I) chloride (CuCl), or copper (II) acetylacetonate. The morphology of the metal sources can be, but not limited to, amorphous powder, pellets, flakes, beads, bulk pieces, and films. The term "metal containing precursor solution" refers to a precursor solution containing at least one of the metal sources, metal chalcogenides, or metal oxides.

As used herein, the term "chalcogen" refers to at least one of sulfur (S) and selenium (Se) from group 16 of the periodic table. The morphology of the elemental chalcogens can be, but is not limited to, amorphous powder, pellets, flakes, beads, bulk pieces, and films. The term "chalcogen containing precursor solution" refers to a precursor solution containing at least one of the chalcogen sources, including elemental chalcogens and metal chalcogens.

As used herein, the term "metal chalcogenide" refers to a compound that contains at least one type of metal element among metals defined, particularly Cu, Zn, Sn, In, Ga, Cd, Ge and Pb, and at least one of S, Se, or both. Examples of metal chalcogenides include, but are not limited to, SnS, SnSe, $SnS_2$, $SnSe_2$, $Cu_2S$, $Cu_2Se$, CuS, CuSe, $In_2S_3$, $In_2Se_3$, $Ga_2S_3$, $Ga_2Se_3$, $CuInS_2$, $CuInSe_2$, CdS, CdSe, PbS, PbSe, $CuIn(S,Se)_2$, $CuInGaS_2$, $CuInGaSe_2$, $CuInGa(S,Se)_2$, $Cu_2ZnSnS_4$, $Cu_2ZnSnSe_4$, and $Cu_2ZnSn(S,Se)_4$.

As used herein, the term "metal oxide" refers to a compound that contains at least one oxygen atom and at least one type of metal among metals defined. Examples of metal oxides include, but not limited to, $Cu_2O$, ZnO, SnO, and multinary oxide such like $MgAl_2O_4$ and $Na_2Al_2Si_3O_{10} \cdot 2H_2O$.

As used herein, the term "amine" refers to an organic compound having at least one of amino groups. Herein, the amino group is

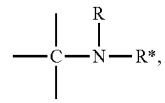

wherein R and R* represent any alkyl, aryl, and/or hydrogen (wherein R=R* or R≠R*, alkyl=alkane, alkene, alkyne). The organic compound with at least two amino groups can also be called as polyamine. The "amine" used in this disclosure refers to primary, secondary, tertiary amine, and/or polyamine (e.g. diamine and triamine), and the carbon chain ranges from C2 to C24. The primary amine has the structure of

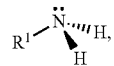

where R1 represents an alkyl, aryl group, alcohol group with a formula of —R'OH (R'=alkyl), and/or carboxylic acid group with a formula of —R"COOH (R"=alkyl and/or aryl). The examples of primary amine are butylamine, hexylamine, oleylamine, and ethanolamine. The secondary amine has the structure of

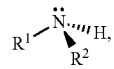

where R1 and R2 represent an alkyl, aryl group, alcohol group with a formula of —R'OH (R'=alkyl), and/or carboxylic acid group with a formula of —R"COOH (R"=alkyl and/or aryl). The examples of secondary amine are dimethylamine and diethylamine. The tertiary amine has the structure of

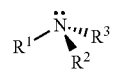

and where R1, R2, and R3 represent an alkyl, aryl group, alcohol group with a formula of —R'OH (R'=alkyl), and/or carboxylic acid group with a formula of —R"COOH (R"=alkyl and/or aryl). The example of tertiary amine is triethylamine. A primary diamine is a type of polyamine with exactly two amino groups, —$NH_2$. The structure of primary diamine is $H_2N$—R4-$NH_2$, where R4 represents any alkyl and/or aryl group. The examples of primary diamine are ethylenediamine and hexamethylenediamine.

As used herein, the term "thiol" refers to an organosulfur compound that contains one or more carbon-bonded sulfhydryl (R5-SH) group, where R5 represents any alkyl, aryl group, alcohol group, —R'OH (R'=alkyl), and/or carboxylic acid group, —R"COOH (R"=alkyl and/or aryl). The size of carbon chain ranges from C2 to C16. Examples of thiol can be ethanethiol, propanethiol, dodecanethiol, and thioacetic acid.

As used herein, a thiol having two carbon-bonded sulfhydryl (—C—SH) groups with a formula of HS-R6-SH (R6=alkyl and/or aryl group), is called as dithiol. The examples of dithiol are 1,2-ethanedithiol and 1,3-propanedithiol. All the examples are for embodiment purposes.

As used herein, the term "amine-thiol mixture" or "a mixture of amine and thiol" represents a mixture of at least one type of amine among amines and at least one type of thiol among thiols. The term "amine-dithiol mixture" or "a mixture of amine and dithiol" refers to a mixture of at least one type of amine among amines and at least one type of dithiol among dithiols. Note that multiple amines or multiple thiols/dithiols can be used in an amine-thiol/dithiol mixture. For the dissolution of different types of metal sources and chalcogens, the types and structures of amine(s) and thiol(s) are specifically described as follows.

As used herein, the term "nanoparticle" means a particle or a crystal with at least one dimension having a size between about 1 nm to about 1000 nm, preferably between about 1 nm to 100 nm, more preferably between about 1 nm to about 25 nm, or most preferably between about 1 nm to about 15 nm.

As used herein, the term "CZTSSe" refers to a material having a composition of $Cu_{2-x}Zn_{1+y}Sn(S_{1-z}Se_z)_{4+q}$, wherein $0 \leq x \leq 1$, $0 \leq y \leq 1$, $0 \leq z \leq 1$; $-1 \leq q \leq 1$, in the form of nanoparticles, coating layers containing nanoparticles thin films, bulks, etc.

As used herein, the term "CIGSSe" refers to a material having a composition of $Cu_x(In_{1-y}Ga_y)(S_{1-z}Se_z)_{2+q}$, where in $0 \leq x \leq 1$, $0 \leq y \leq 1$, $0 \leq z \leq 1$; $-1 \leq q \leq 1$.

As used herein, the term "solution" refers to a pure liquid phase wherein at least one dissolved material and at least one solvent are present.

As used herein, the term "precursor" refers to a solution containing desired elements or an ink containing desired nanoparticles as a reactant in nanoparticle synthesis or material deposition prior to a terminal annealing step.

As used herein, the term "molecular precursor" or "precursor solution" refers to a true solution in which the elements are homogeneously mixed at a molecular level.

As used herein, the term "stoichiometry" refers to a formula showing the actual relative amount of each element in a nanoparticle/nanoparticles, a precursor, and a thin film. A stoichiometric formula can be balanced or unbalanced. A "balanced" stoichiometric formula is one in which a just sufficient amount of each element forms a perfect crystal structure of the material with the occupancy of each crystal lattice site equals to 1. Practically there are some defects in the crystal at room temperature, and thus the actual formula of the material can slightly deviate from the balanced stoichiometry. An "unbalanced" stoichiometric formula is one in which the amount of one element exhibits an excess and/or deficiency relative to another element.

As used herein, the term "solid-phase material" means any material/materials in a form of solid which has a well-defined shape and volume. The atoms in a solid are tightly bound to each other, either in a regular geometric lattice (i.e., a crystallized solid) or an irregular network (i.e., an amorphous solid). The term "solid-phase metal chalcogenide" refers to metal chalcogenide(s) in the form of solid.

As used herein, the term "porous structure" refers to a material structure with certain porosity in volume. The porous structure can be a porous bulk material, a porous particle, or a porous thin film. The porous bulk materials can be, but not limited to, metal, ceramic, and polymer foams, porous polymer structures, porous silicon, etc.; the porous particles can be, but not limited to, polymer particles with pores at the surface or throughout the particles and dealloyed metal or ceramic particles; and the porous thin films can be, but not limited to, particle/nanoparticle coated thin films (e.g. CZTS nanoparticle-coated thin films and titanium oxide particle-coated thin films).

As used herein, the term "surface" represents the top layer of the film with the thickness ranging from 1 angstrom to 1 micrometer, preferably from few nanometers to a few hundred nanometers.

Precursor Solution Preparation:

The preparation of a molecular precursor is crucial for the deposition of multinary metal chalcogenide films and the growth of compositional homogenous nanocrystals. This present disclosure demonstrates success in fulfilling this demand. For dissolving the elemental metal(s), metal salt(s) and organometallic complex(es), the amine can be, but is not limited to, primary, secondary, tertiary amine, polyamine (e.g. diamine, triamine), and the amine carbon chain ranges from C2 to C24, while the thiol should have the structure of R5-SH and/or HS-R6-SH, with the carbon chain ranging in size from C2 to C16. Herein, R5 represents any alkyl, aryl group, alcohol group, —R'OH, and/or carboxylic acid group, —R"COOH, whereas R6 represents any alkyl and/or aryl group. For dissolving the metal chalcogenide(s), the amine can be primary, secondary, tertiary amine, polyamine (e.g. diamine, triamine), and the amine carbon chain ranges from C2 to C24, while the thiol should be dithiol with the structure of HS-R6-SH wherein R6 represents any alkyl and/or aryl group. For dissolving the metal oxide(s), the amine can be primary, secondary, tertiary amine, and/or polyamine, and the amine carbon chain ranges from C2 to C24, while the thiol should have the structure of R5-SH and/or HS-R6-SH, with the carbon chain ranging in size from C2 to C16. Herein, R5 represents any alkyl, aryl, alcohol and other non-carboxylic acid functional group. R6 represents any alkyl and/or aryl group. For the dissolving of chalcogens, the amine can be primary, secondary, tertiary amine, and/or polyamine, and the amine carbon chain ranges from C2 to C24, while the thiol should have the structure of R5-SH and/or HS-R6-SH, with the carbon chain ranging in size from C2 to C16. Herein, R5 represents any alkyl, aryl, alcohol group, —R'OH, and/or carboxylic acid group, —R"COOH, whereas R6 represents any alkyl and/or aryl group. As mentioned above, in order to prepare the homogeneous solution with multiple metal sources, multiple amines and thiols can be employed in the amine-thiol mixture.

In order to prepare the metal chalcogenide precursor solution, the dissolution of metal source(s) and chalcogen(s) can be performed simultaneously, stepwise, and separately. The term "simultaneously" means the metal source(s) and chalcogen(s) contact with the mixture of amine and thiol at the same time. The term "stepwise" means the metal source(s) and chalcogen(s) contact with the mixture of amines and thiols following a specific sequence. For example, copper (I) chloride is first dissolved in 1-butylamine and propanethiol mixture (vol 1:1) and then indium chloride is added into this solution. Finally, S flakes are dissolved into this solution to form the precursor for $CuInS_2$. The term "separately" means the metal source(s) and the chalcogen(s) are dissolved in separate containers using the mixture of amine and thiol, and finally combined together to form the precursor. For example, i.) the contacting of mixture of amines and thiols, a source of Cu, a source of Zn, and a source of Sn forms solution A; ii.) the contacting of mixture of amines and thiols, a source of at least one of S and Se forms solution B. According to an exemplary embodiment, the final concentration of element chalcogen in the precursor solution contains at least 1 μM of S and/or Se (preferably more than 0.01 M); iii.) mixing of solution A and solution B under condition sufficient forms a homogeneous precursor solution for the deposition of $Cu_{2-x}Zn_{1+y}Sn(S_{1-z}Se_z)_{4+q}$ wherein $0 \leq x \leq 1$, $0 \leq y \leq 1$, $0 \leq z \leq 1$; $-1 \leq q \leq 1$. The metal-to-metal and metal-to-chalcogen ratio in the precursor solution can be balanced or unbalanced stoichiometric. The ratio of S:Se can be tuned in order to achieve a desired composition in the resulting chalcogenide thin film. For example, S and Se can be dissolved in the mixture of 1-butylamine and ethanethiol with volume ratios ranging 5:1 to 1:1.

During the preparation of solutions and the mixing of solutions, agitation can be performed to facilitate the formation of homogeneous solutions. By way of example only, magnetic stirring or physical stirring (e.g. rod stirring) can be employed. For example, the solution A with 0.1485 g CuCl, 0.1022 g $ZnCl_2$, and 0.2909 g tin (IV) bis(acetylacetonate) dichloride in 3 ml 1-butylamine and 1-propanethiol (vol ratio 2:1), can be stirred at 2,000 rpm for at least 0.5 hours at room temperature for total dissolution. Sonication, as provided by but not limited to an ultrasonic bath or ultrasonic probe, can also be employed to agitate the solution. The frequency of ultrasound can be varied from 10 kilohertz (kHz) to 10 megahertz (MHz) and the power of the ultrasound can range from 100 to 1000 watts. The preparation of solutions can involve heating at temperatures higher than the room temperature in order to accelerate the dissolution process. For example, when dissolving 0.17 g Zn metal in 5 ml of ethylenediamine and 1-propanethiol (vol ratio 1:1), heating at 60° C. for 30 sec helps in shortening the dissolution process from 48 hrs to <6 hrs.

Thin Film Deposition:

In another aspect of the disclosure, this solution method enables the deposition of a variety of metal chalcogenide thin films from precursor solutions. The solution is stable under certain conditions. The term "stable" means there are no precipitates formed under sufficient conditions of processing. The processing duration can be from the order of a minute to hours or days. For example, a certain precursor solution is stable for more than 1 day, at ambient pressure and at temperature ranging from about 0° C. to about 200° C., preferably at room temperature. The metal chalcogenide films deposited can be, but not limited to, SnS, SnSe, $SnS_2$, $SnSe_2$, ZnS, ZnSe, $Cu_2S$, $Cu_2Se$, CuS, CuSe, $In_2S_3$, $In_2Se_3$, $Ga_2S_3$, $Ga_2Se_3$, $CuInS_2$, $CuInSe_2$, CdS, CdSe, PbS, PbSe, $CuIn(S,Se)_2$, $CuInGaS_2$, $CuInGaSe_2$, $CuInGa(S,Se)_2$, $Cu_2ZnSnS_4$, $Cu_2ZnSnSe_4$, and $Cu_2ZnSn(S,Se)_4$. Furthermore, this solution method can be extended to the deposition of other materials, such as elemental metals, metal alloys, metal oxides, etc. The thin film deposited can be a thin film with compositional and morphological homogeneity, a thin film with compositional uniformity and hierarchical structure, a thin film with compositional gradient and morphological homogeneity, or a thin film with both compositional gradient and hierarchical structure.

FIG. 1 depicts the main steps during the film deposition. The techniques used to apply the solution on a substrate can be, but are not limited to, spin coating, doctor blading, inkjet printing, dip coating, spray coating (or electrical spray coating), and roll-to-roll printing. Proper dry process is performed after the deposition of each layer at a temperature ranges from 20° C. to 550° C. The deposition of layers can be repeated until the desired thickness is obtained. The heat treatment for the whole thin film is performed at an elevated temperature of from 50° C. to about 700° C., preferably from 200° C. to 550° C. This heat treatment can be performed in gaseous atmosphere, vacuum, vapor of chalcogen(s) or under chalcogen compound treatment. The final deposited films can be applied on the substrates of, but not limited to, metals, oxides, silicon, polymers, a layer of molybdenum, glass and any combination thereof. The phase of $CuInS_2$, $CuInSe_2$, $CuInGaS_2$, $CuInGaSe_2$, $CuInGa(S,Se)_2$, $Cu_2ZnSnS_4$, $Cu_2ZnSnSe_4$, and $Cu_2ZnSn(S,Se)_4$ formed by using the above-mentioned solution can be, but is not limited to, chalcopyrite, sphalerite, kesterite, stannite, or wurtzite phase. Last but not least, the precursor solution can be applied on chalcogenide nanoparticle-coated films before heat treatment in order to tune the stoichiometry of the resulting chalcogenide thin films or modify the grain growth behavior of chalcogenide thin films. For example, a copper-containing solution is spin coated on a CZTS nanoparticle film before the selenization process in order to improve the crystallinity and stoichiometry of the final film.

Figure 2:
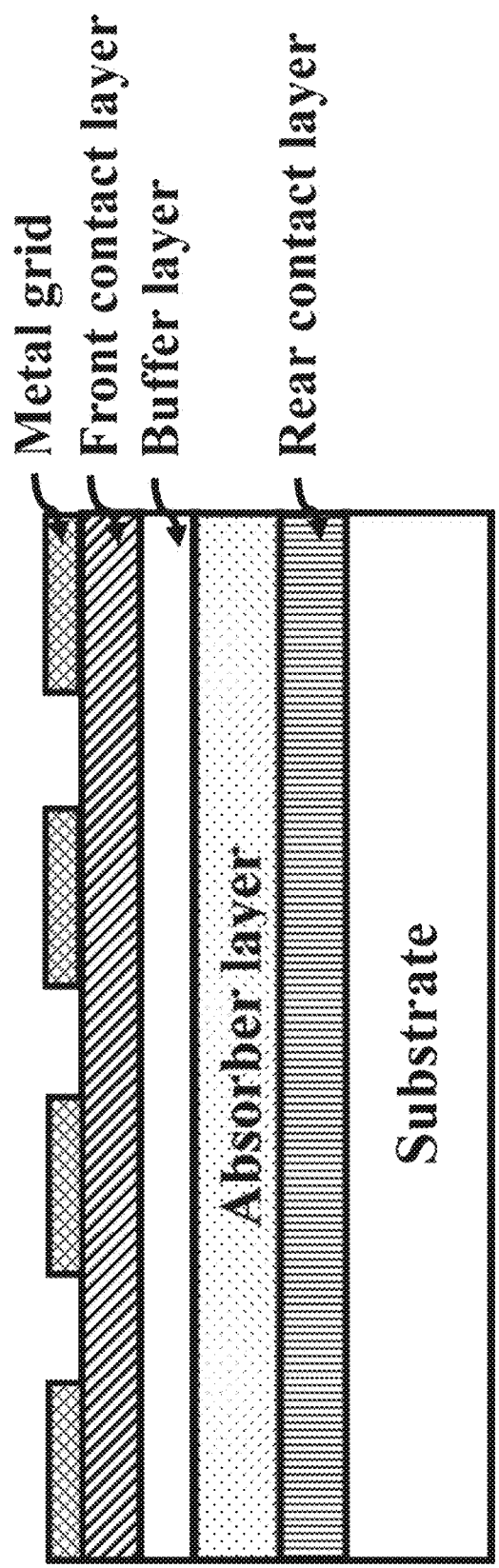
FIG. 2 is a cross-sectional diagram depicting a completed device with a top electrode, a buffer layer, an n-type semiconducting layer, an absorber layer, a back contact layer, and a substrate from the top to the bottom according to an embodiment of the present disclosure.

The herein disclosed techniques can be employed in the fabrication of photovoltaic devices. As shown in FIG. 2, the metal chalcogenide thin film is deposited on the conductive layer. According to an exemplary embodiment, the absorber layer has a thickness of, but not limited to, from 600 nm to 2 μm. The various layers of the solar cells can be deposited using vacuum-based or solution-based approaches. Those layers can be buffer layers, conductive layers, and metallic electrodes.

Particle Synthesis and Ink Fabrication:

In another aspect, the present disclosure provides a method for preparing metal chalcogenide nanoparticles and metal chalcogenide nanoparticle inks from the amine-thiol based precursor solutions at a low temperature (e.g. at room temperature). The nanoparticles are formed after mixing the metal containing precursor solution and chalcogen containing precursor solution at a sufficient condition. After synthesis, the nanoparticles can be collected, washed, and suspended in solvent(s) to form a nanoparticle ink. Aiming to prepare the nanoparticle inks, two routes: ex-situ addition and/or in-situ formation of the nanoparticles can be employed. The combination of nanoparticles and the amine-thiol based precursor solution together provides the required stoichiometry for the final deposited film. The nanoparticles, such as metallic nanoparticles, chalcogen nanoparticles, metal chalcogenide nanoparticles, can be added and/or formed in a precursor solution, including a metal containing precursor, a chalcogen containing precursor, and a metal chalcogen precursor, to form a metal chalcogenide ink with a desired final stoichiometry. Typically, a nanoparticle ink solution can be formulated so that the nanoparticle concentration in the ink solution ranges between about 0.1% to 60% by volume, preferably between about 0.1% to 20% by volume. It should be noted that not only nanoparticles but also mesoparticles or even larger particles can be synthesized using this precursor solution route.

In one embodiment, the synthesis of metal chalcogenide nanoparticles is carried out by reacting metal precursors (Solution A) with chalcogen precursors (Solution B) under conditions sufficient to form a plurality of metal chalcogenide nanoparticles. The reaction can be carried out at room temperature to about 300° C., preferably between about 25° C. to about 250° C.

Figure 3:
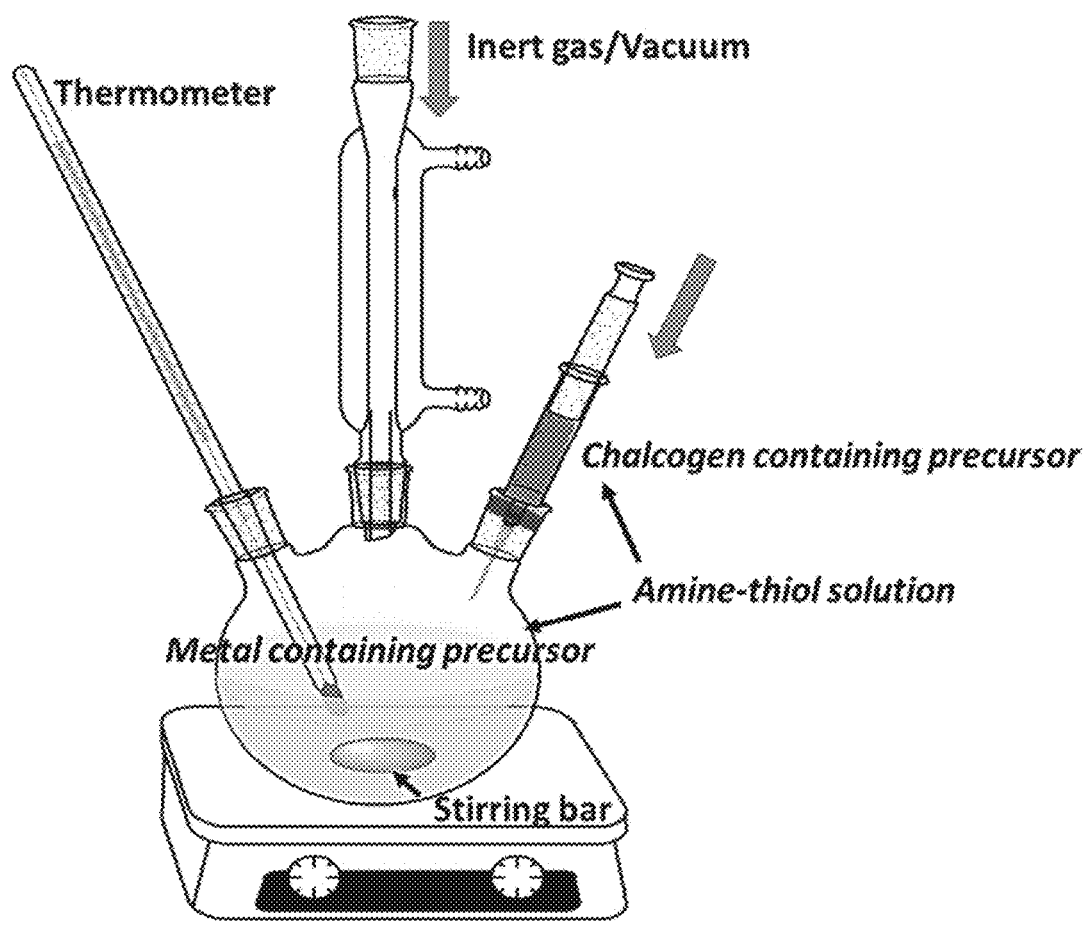
FIG. 3 illustrates the experimental apparatus for the synthesis of metal chalcogenide nanoparticles.

FIG. 3 is a schematic illustration of an exemplary experimental apparatus for synthesizing metal chalcogenide nanoparticles. The solution A, metal containing precursor, is placed inside the three neck flask. One neck of the flask is connected to a thermocouple/thermometer for monitoring the reaction temperature within the reaction flask. A second neck is connected to a condenser and then a Schlenk line (not shown), a manifold which connects to a vacuum pump and an inert gas supply. The reaction apparatus can be purged by switching between vacuum and inert gas flows. A third neck is sealed with a rubber stopper, serving as an injection port for solution B, chalcogen containing precursors. A magnetic stirrer can be placed inside the flask to keep the reactionsolution well mixed. A heating mantle or oil(s) and bath can be used as the heat source. After solution A and solution B are combined, the mixture can be incubated for a certain time under conditions suitable for forming nanoparticles. The morphology of the nanocrystals produced can be, but are not limited to, spheres, disks, rods, cubes, sheets, ribbons, and polyhedra, consistent with the growth shape and crystalline defects present in the nanoparticles. The obtained nanoparticles can be collected, washed, and resuspended in solvent(s) or the nanoparticles and the residual precursor (with addition of other precursors) can be directly used for thin film deposition.

Fabrication of Devices:

In a further aspect, this disclosure provides a method of fabricating the devices using the metal chalcogenide precursors, nanoparticles, nanoparticle inks, or thin films deposited using the above precursors, nanoparticles, and/or inks. The devices can be fabricated comprise photovoltaic devices, optical devices, transistors, thermoelectric devices, sensors and/or other non-listed semiconducting devices. Examples of photovoltaic devices are thin film solar cells, dye-sensitive solar cells, etc., and examples of optical devices are light emitting diodes, laser diodes, photondiodes, photoconductive sensors, etc.

Precursor in Material Infiltration, Surface Treatment, and Etching Application:

Since the precursors for the deposition of a variety of inorganic materials have been obtained, the present disclosure enables the infiltration of the inorganic materials into porous structures. By contacting the porous structure with the precursor of metal source(s), metal chalcogenide(s), and/or metal oxide(s), and performing subsequent drying and heat treatment, solid phase materials can be incorporated into the porous structure. The porous structure can be a porous bulk material, a porous particle, or a porous thin film. The porous bulk materials can be, but not limited to, metal, ceramic, and polymer foams, porous polymer structures, porous silicon, etc.; the porous particles can be, but not limited to, polymer particles with pores at the surface or throughout the particles and dealloyed metal or ceramic particles; and the porous thin films can be, but not limited to, particle/nanoparticle coated thin films (e.g. CZTS nanoparticle-coated thin films and titanium oxide particle-coated thin films). In one embodiment, the CZTSSe precursor solution can be infiltrated into the titanium oxide particle-coated thin film in order to fabricate solar cells.

In addition, the precursor solution of metal source(s), metal chalcogenide(s), and/or metal oxide(s) can be employed on the surface of a metal chalcogenide thin film to modify the surface composition, structure, and morphology, and thus change the surface band structure, optimize the light absorption, compensate for element loss during heating treatment, or fulfill other non-listed purposes. For example, a common challenge found in kesterite CZTSSe layer fabrication is the loss of tin due to the volatile nature of tin chalcogenide compounds during selenization. The tin-rich precursor solution can be used as the capping layer on the surface of CZTSSe thin film in order to compensate for tin loss.

Last but not least, the present disclosure provides a method to remove undesired materials by using the amine-thiol mixture. This lies in the fact that several metal containing materials or chalcogen containing materials have appreciable solubility in this type of universal solvent mixture. As an example, the copper-rich secondary phase (e.g. $Cu_2Se$) formed after selenization can be removed by soaking the sample into the amine-thiol mixture, wherein the amine can be primary, secondary, tertiary amine, diamine, triamine, and the amine carbon chain ranges from C2 to C24, while the thiol can have the structure of HS-R6-SH ranging in size from C2 to C16.

EXAMPLE 1

Dissolving of Metal Sources Using Amine and Thiol

Chemicals:

Zinc powder, Zn (>=99% Aldrich), copper (I) oxide, $Cu_2O$ (>=99.99% Aldrich), copper (II) sulfide, CuS (99.99%, Aldrich), butylamine (99.5% Aldrich), propanethiol (99% Aldrich), 1,2-ethanedithiol (>=90% Aldrich).

Figures 4A, 4B, 4C:
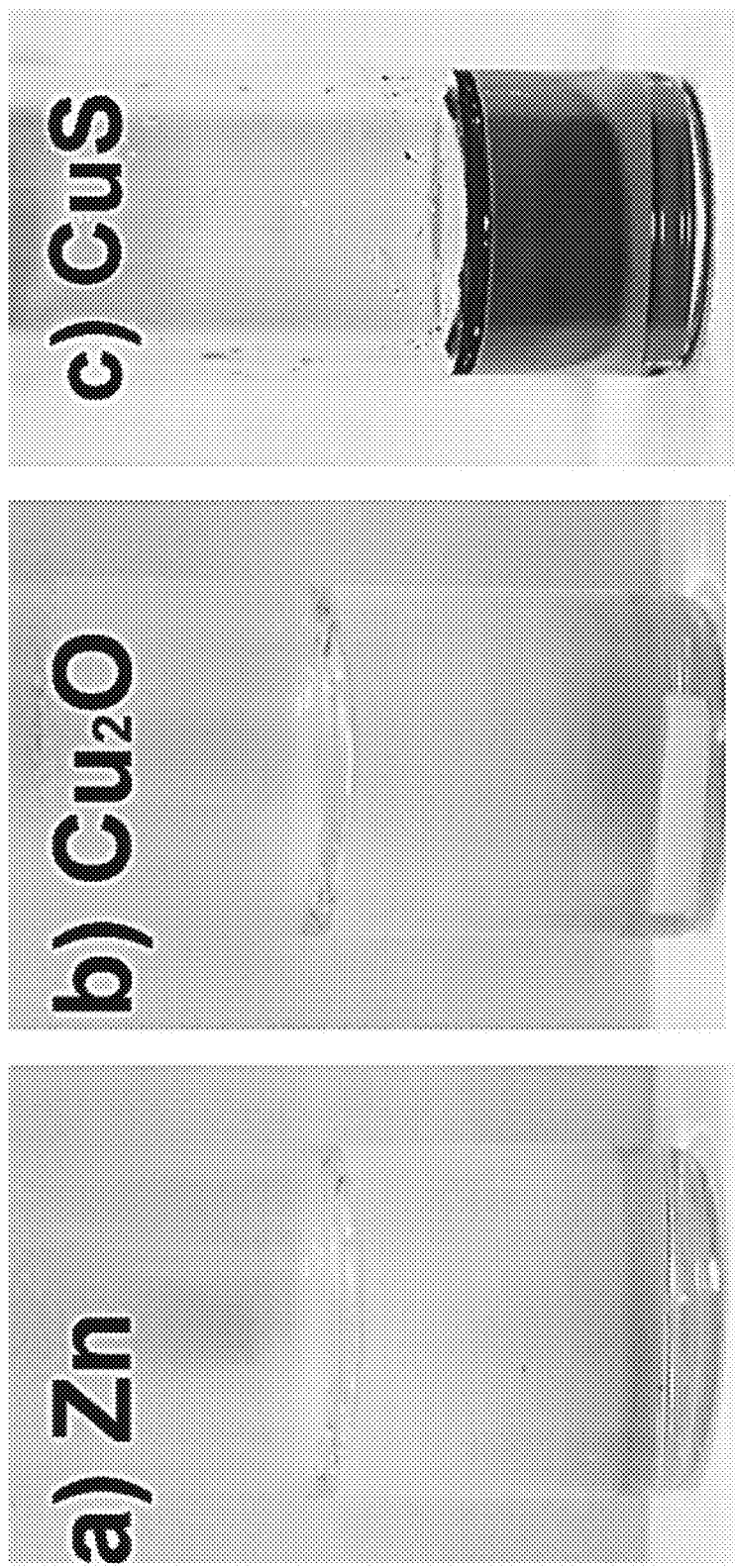
FIGS. 4a-4c show examples of amine-thiol based solutions formed from a metal, a metal oxide, and a metal chalcogenide.

Solution Preparation:

In this example, 0.065 g Zn powder was contacted with 2 ml mixture of butylamine and propanethiol (vol 1:1) at room temperature. Stirring for 72 hrs yielded a transparent zinc containing solution (FIG. 4a). 0.0859 g $Cu_2O$ powder was contacted with 2 ml mixture of butylamine and propanethiol (vol 1:1) at room temperature. After 48 hrs stirring, a yellow solution was obtained (FIG. 4b). 0.0574 g copper (II) sulfide was dissolved in 2 ml mixture of oleylamine and 1,2-ethanedithiol (vol 1:1). After 48 hrs, the particle suspension changed to a transparent brown solution (FIG. 4c).

Preparing Metal Chalcogenide Precursor Using Amine and Thiol Mixture

Chemicals:

Selenium powder, Se (100 mesh 99.99% Aldrich), sulfur powder, S (99.98% Aldrich), propanethiol (99% Aldrich), hexylamine (99% Sigma-Aldrich), copper (I) chloride, CuCl (>=99.995% Aldrich), zinc chloride, $ZnCl_2$ (99.995% Aldrich), tin (II) chloride, $SnCl_2$ (>=99.99% Aldrich), and tin (IV) bis(acetylacetonate) dichloride, $Sn(acac)_2Cl_2$ (98% Aldrich). All chemicals were used in the as-received form unless otherwise noted.

Figures 5A, 5B, 5C, 5D:
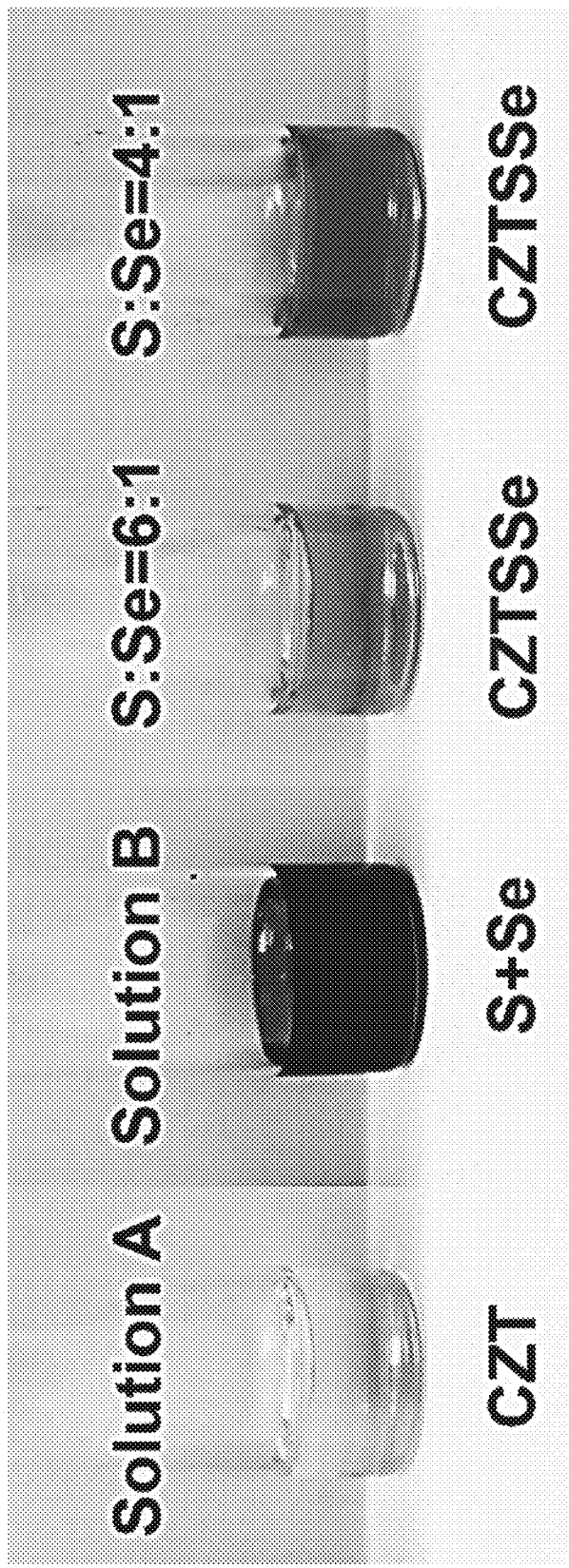
FIGS. 5a-5d illustrate containers with various solutions (left to right).

Solution Preparation:

In this example, solution A was prepared by dissolving CuCl, $ZnCl_2$, and $SnCl_2/Sn(acac)_2Cl_2$ into a mixture of hexylamine and propanethiol (volume ratio 3:1). After stirring the solution at room temperature for 12 hrs, the metal chloride salts have been fully dissolved, ultimately yielding a yellow solution (FIG. 5a). Solution B was prepared by dissolving the Se powder and S flakes into the combination of hexylamine and propanethiol (volume ratio is 1:1). The total concentration of chalcogens (S+Se) was 2 M (mol/L) and the concentration ratio of S to Se can be adjusted in order to modify the grain growth during thin film selenization and the band gap of resulting thin films. The color of solution B is dark red (FIG. 5b). In order to make CZTSSe precursor solution, adequate amount of solution A is mixed with solution B. After perfect mixing, the color of the solution can be transparent orange (concentration ratio of S:Se=6:1) (FIG. 5c) or transparent red (concentration ratio of S:Se=4:1) (FIG. 5d). All operations were performed in a $N_2$ glovebox with water and oxygen less than 0.1 ppm.

EXAMPLE 2

Photovoltaic Device Fabrication

Figure 6:
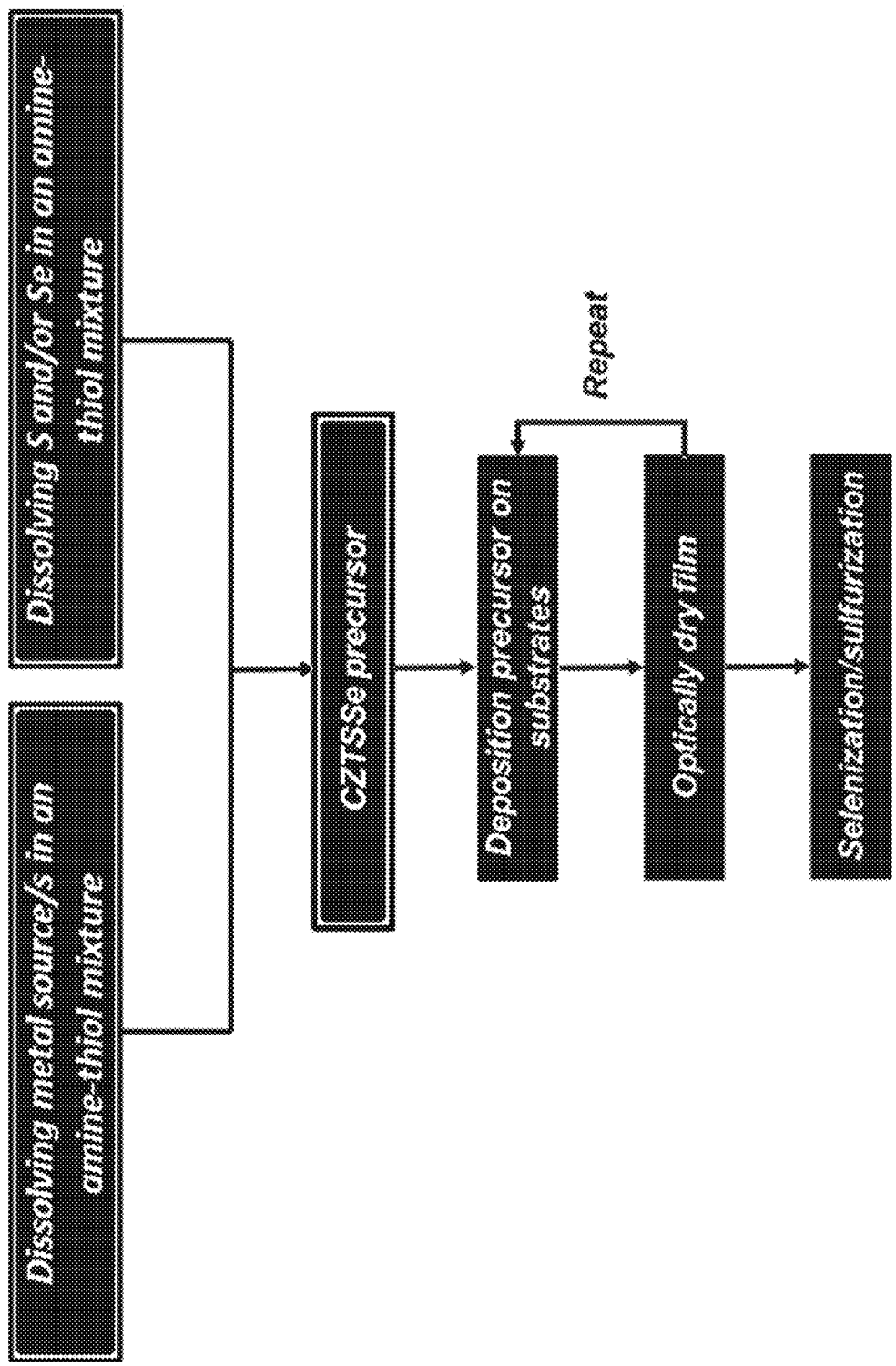
FIG. 6 depicts steps of CZTSSe precursor preparation and CZTSSe thin film deposition.
Figure 7:
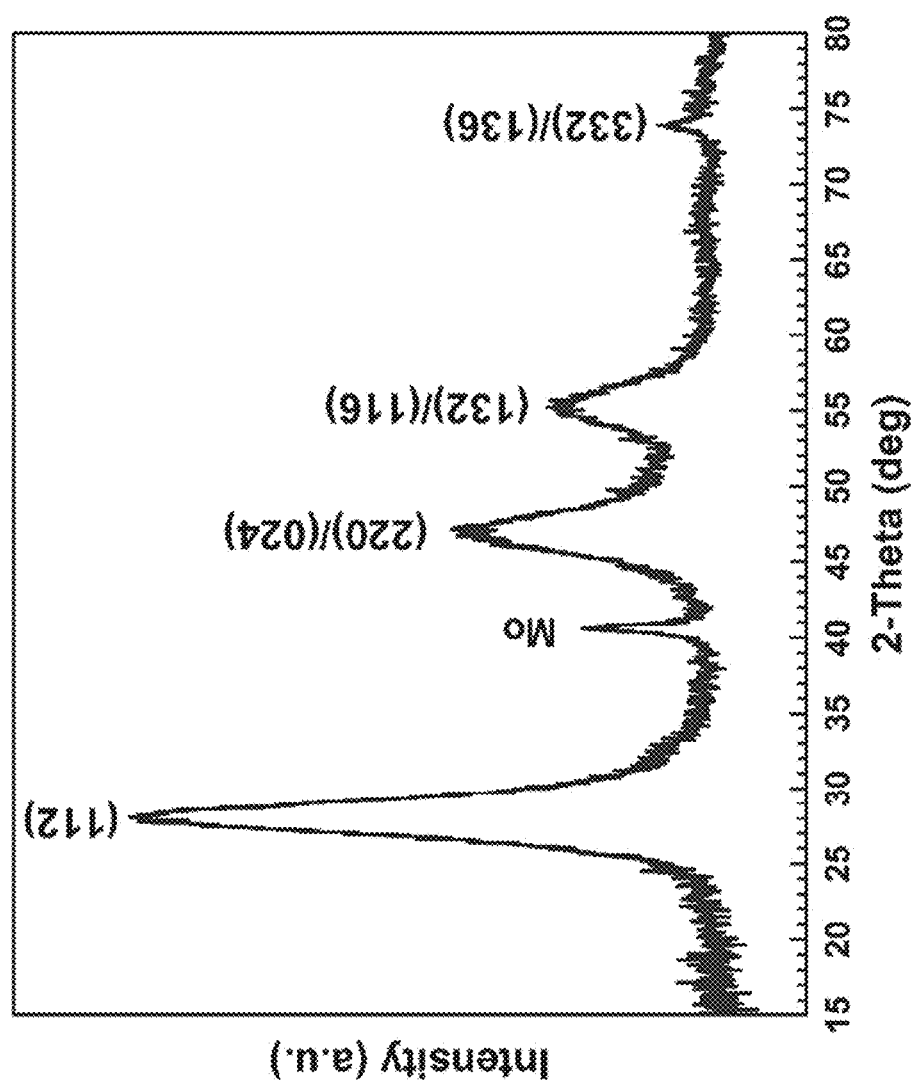
FIG. 7 shows grazing incident XRD pattern of a kesterite CZTS film formed after annealing at 200° C.
Figure 8:
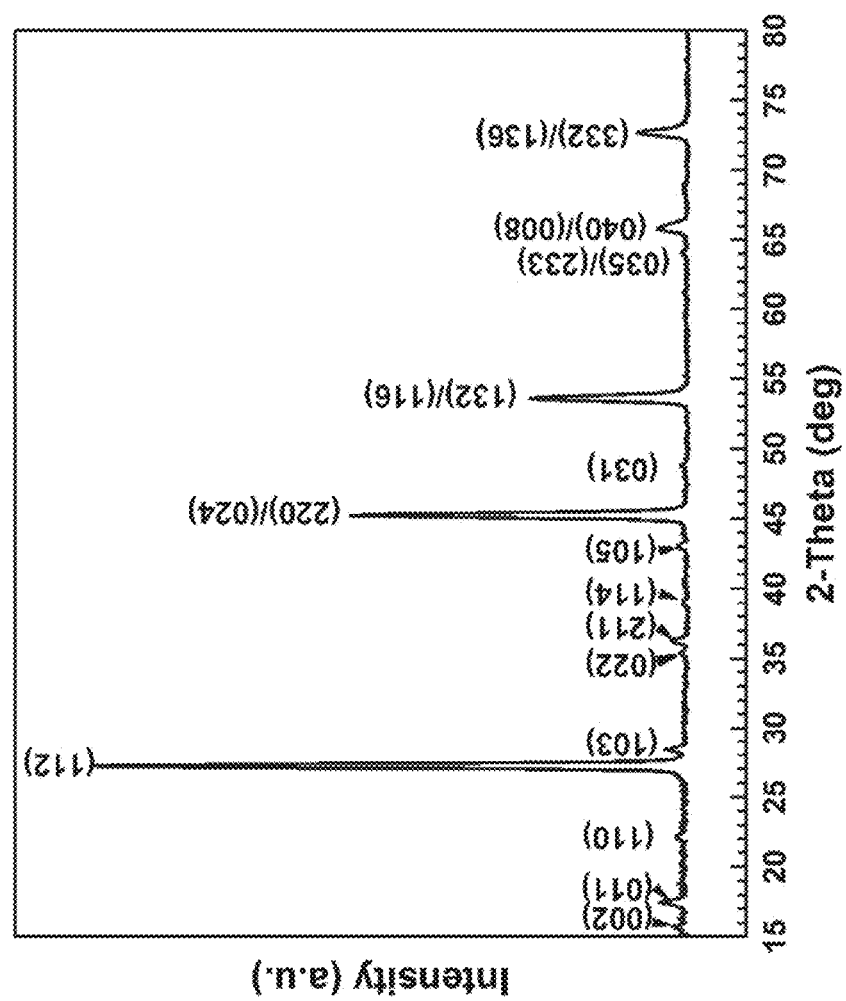
FIG. 8 shows XRD pattern of a kesterite CZTSSe thin film obtained after selenization; all the peaks labeled match with the kesterite CZTSe peaks, with a very small high-angle shift caused by the sulfur substitution.
Figure 9:
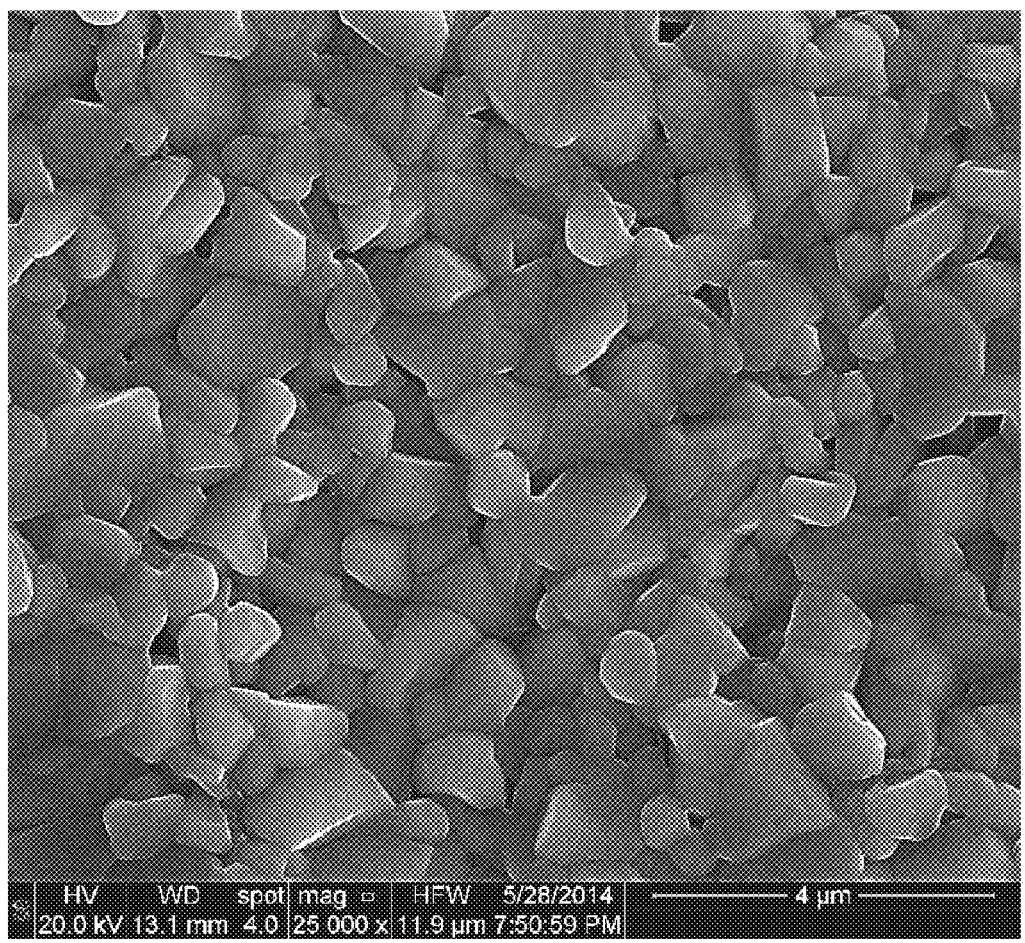
FIG. 9 depicts the top-view scanning electron microscope (SEM) image of a kesterite CZTSSe thin film. The film is continuous and comprised of large grains.
Figure 10:
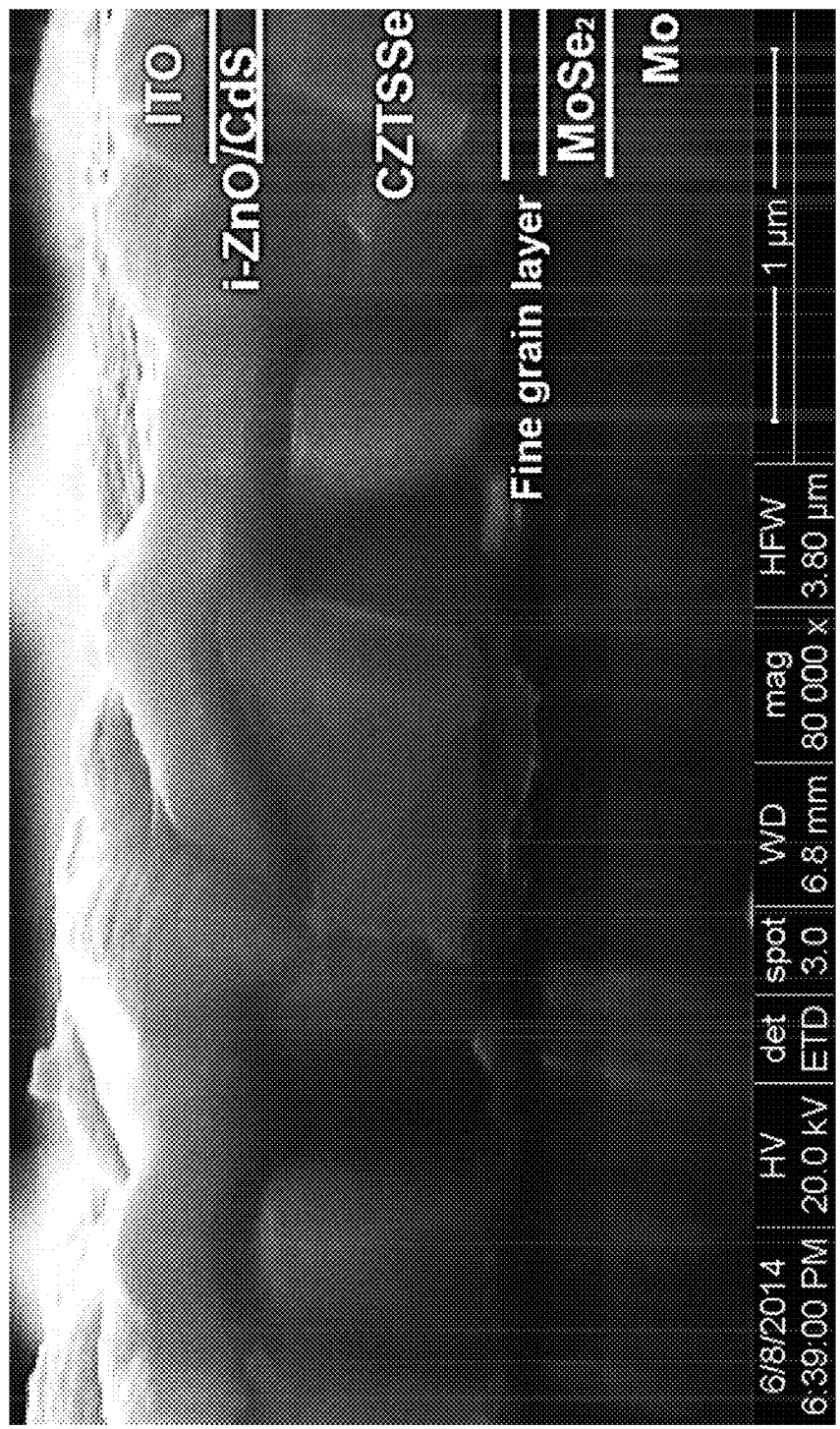
FIG. 10 depicts the cross-sectional SEM image of solar cell fabricated based on a kesterite CZTSSe thin film. The layers from the top to the bottom are ITO/i-ZnO/CdS/~800 nm CZTSSe/MoSe$_2$/Mo.
Figure 11:
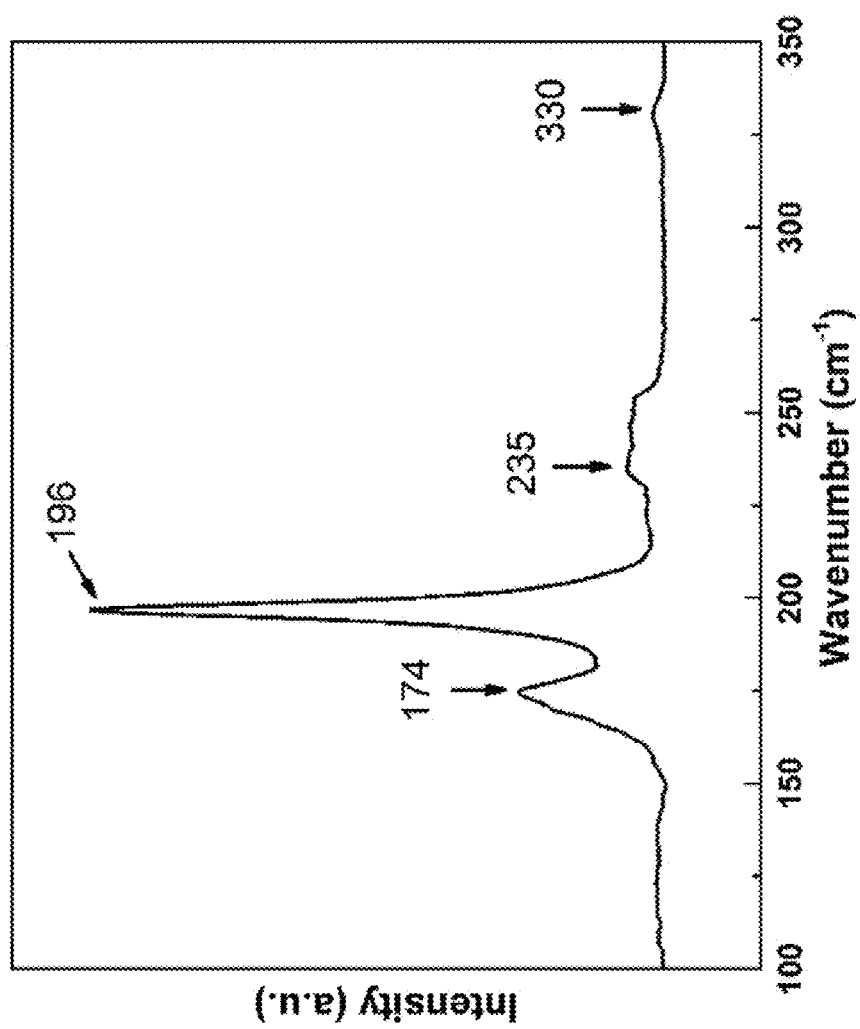
FIG. 11 shows the Raman shift of a kesterite CZTSSe thin film. The peaks at 174 cm$^{-1}$, 196 cm$^{-1}$, and 235 cm$^{-1}$ belong to kesterite CZTSe, while 330 cm$^{-1}$ corresponds to kesterite CZTS, meaning the film formed is kesterite CZTSe with some Se substituted by S.
Figure 12:
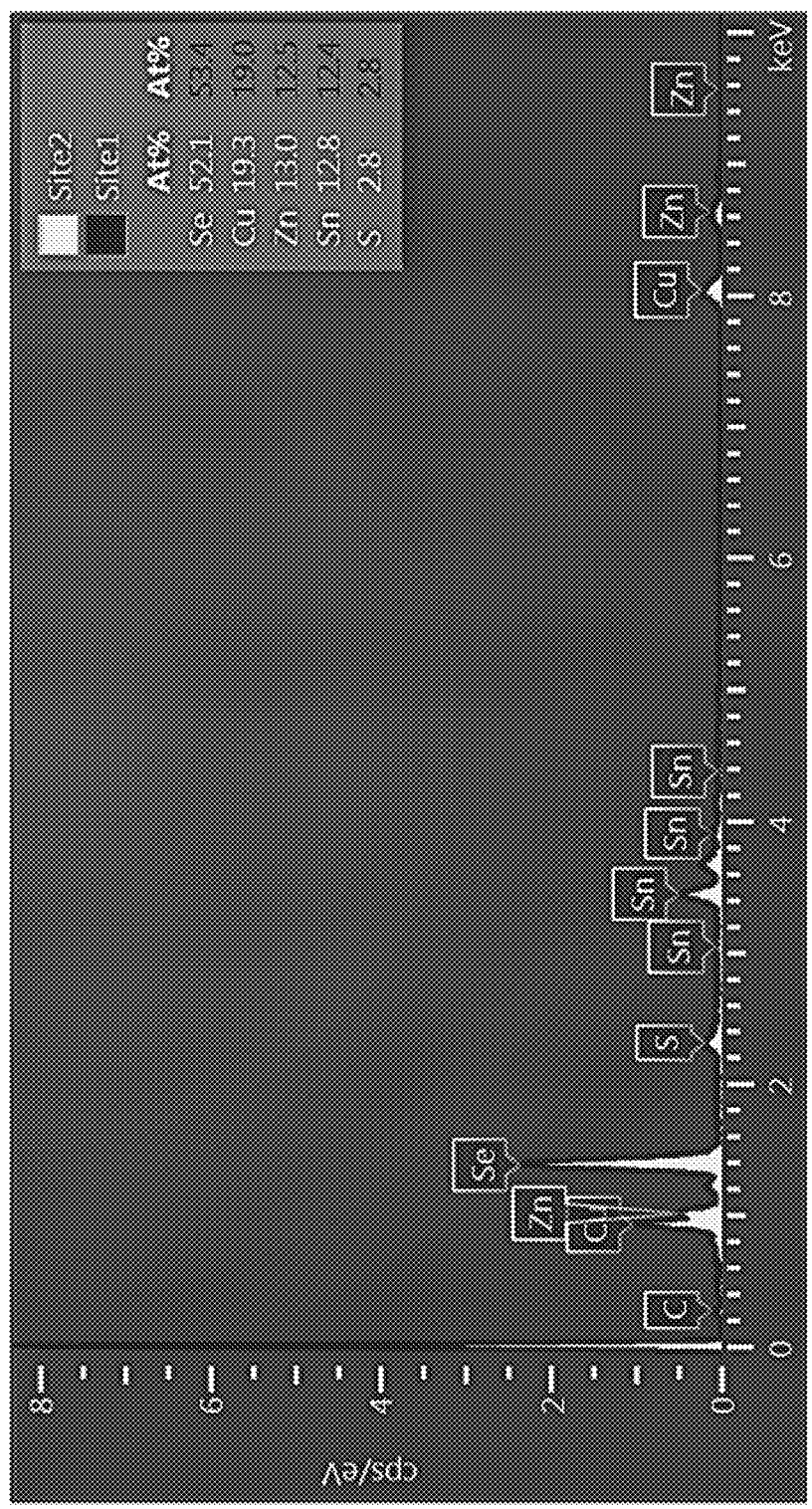
FIG. 12 is an energy-dispersive X-ray spectroscopy (EDX) analysis of two sites on the kesterite CZTSSe thin film.

Film Deposition:

The procedure in EXAMPLE 1 was utilized to prepare the CZTSSe precursor solution. Then the CZTSSe precursor solution was spin coated on a one-by-one inch molybdenum (~800 nm thick) coated soda lime glass (SLG) substrate. After spin coating each layer, the substrate was annealed inside a closed chamber on a hotplate in argon atmosphere at 200° C. for 4 mins. This coating step was repeated until a desirable film thickness is obtained. Then the thin film was further annealed at 500° C. in selenium atmosphere for 20 mins to achieve a better crystallinity. The flow chart in FIG. 6 shows the solution preparation and thin film deposition procedures. The powder X-ray diffraction (pXRD) patterns in FIG. 7 shows that the kesterite CZTS phase has been formed after annealing at 200° C. and after selenization at 500° C. the film was completely converted into a high-crystallinity CZTSSe thin film (FIG. 8). The top-view scanning electron microscope (SEM) image reveals that a high density film composed of large grains formed after selenization (FIG. 9), while the cross-section of the device shows that the fine grain layer/unsintered layer near the molybdenum substrate is very thin by using this disclosed method (FIG. 10). In the Raman spectrum (FIG. 11), peaks at 174 $cm^{-1}$, 196 $cm^{-1}$, and 235 $cm^{-1}$ belong to kesterite CZTSe while 330 $cm^{-1}$ corresponds to kesterite CZTS, showing that the film formed is kesterite CZTSe with some Se substituted by S. The energy dispersive X-ray spectroscopy (EDX) analysis confirmed the presence of Cu, Zn, Sn, S, and Se and the film is compositional homogeneous (FIG. 12).

Device Fabrication:

Solar cells were fabricated from the above-described $Cu_2ZnSn(S,Se)_4$ films by creating the following additional layers: chemical bath deposition of ~50 nm cadmium sulfur (CdS), sputtering of ~50 nm intrinsic zinc oxide (ZnO) and ~250 nm indium-doped zinc oxide (ITO). On the top of the device, Ni/Al metal contacts were deposited by electron-beam deposition.

Figure 13:
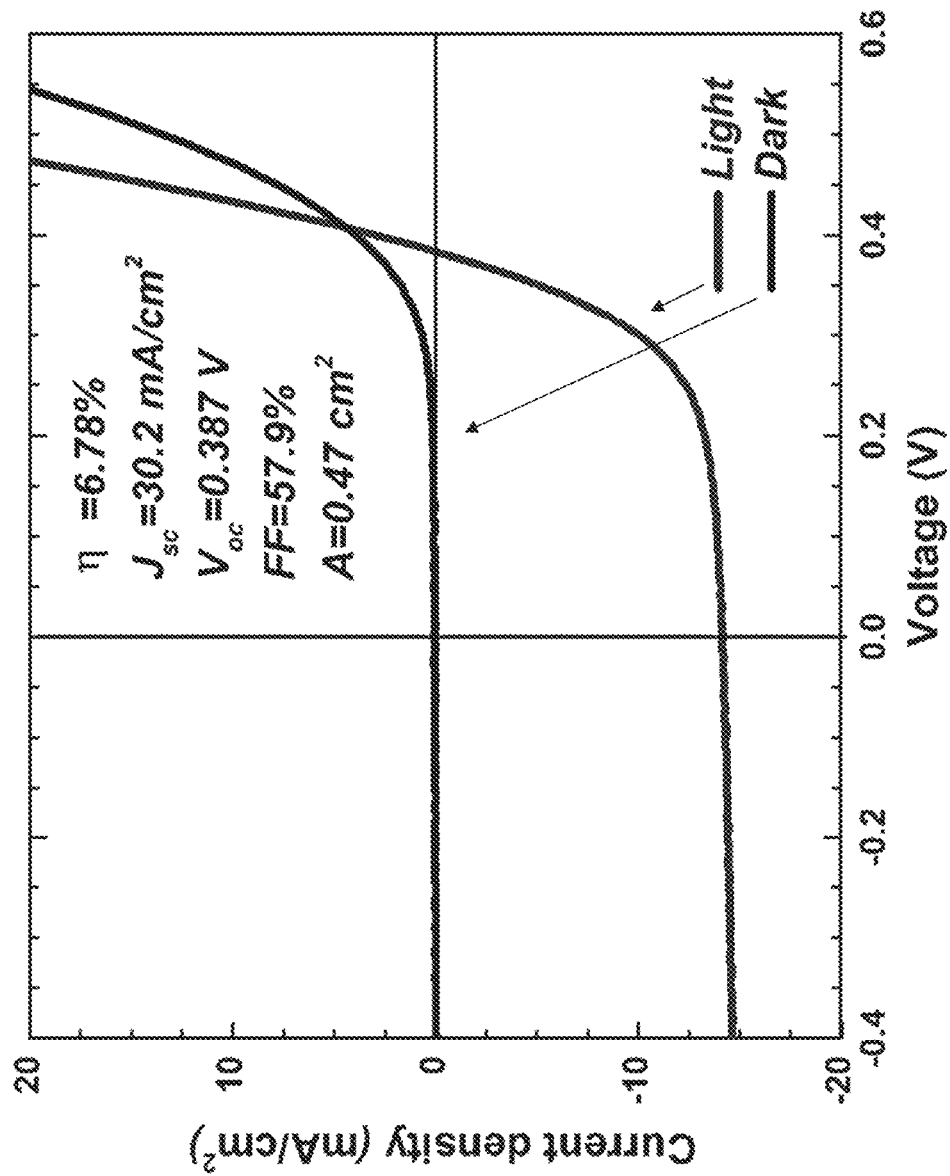
FIG. 13 is I-V curve of solar cell fabricated based on a kesterite CZTSSe thin film.

Photovoltaic performance was measured under AM1.5 illumination. FIG. 13 shows the current-voltage (I-V) data measured under standard AM1.5 illumination based on a cell area of 0.47 $cm^2$. The solar cell has a total area power conversion efficiency of 6.78% with $V_{oc}$=387 mV, $J_{sc}$=30.2 $mA/cm^2$, Fill Factor=57.9%.

EXAMPLE 3

Preparation of Zinc Selenide Nanoparticles

Figure 14:
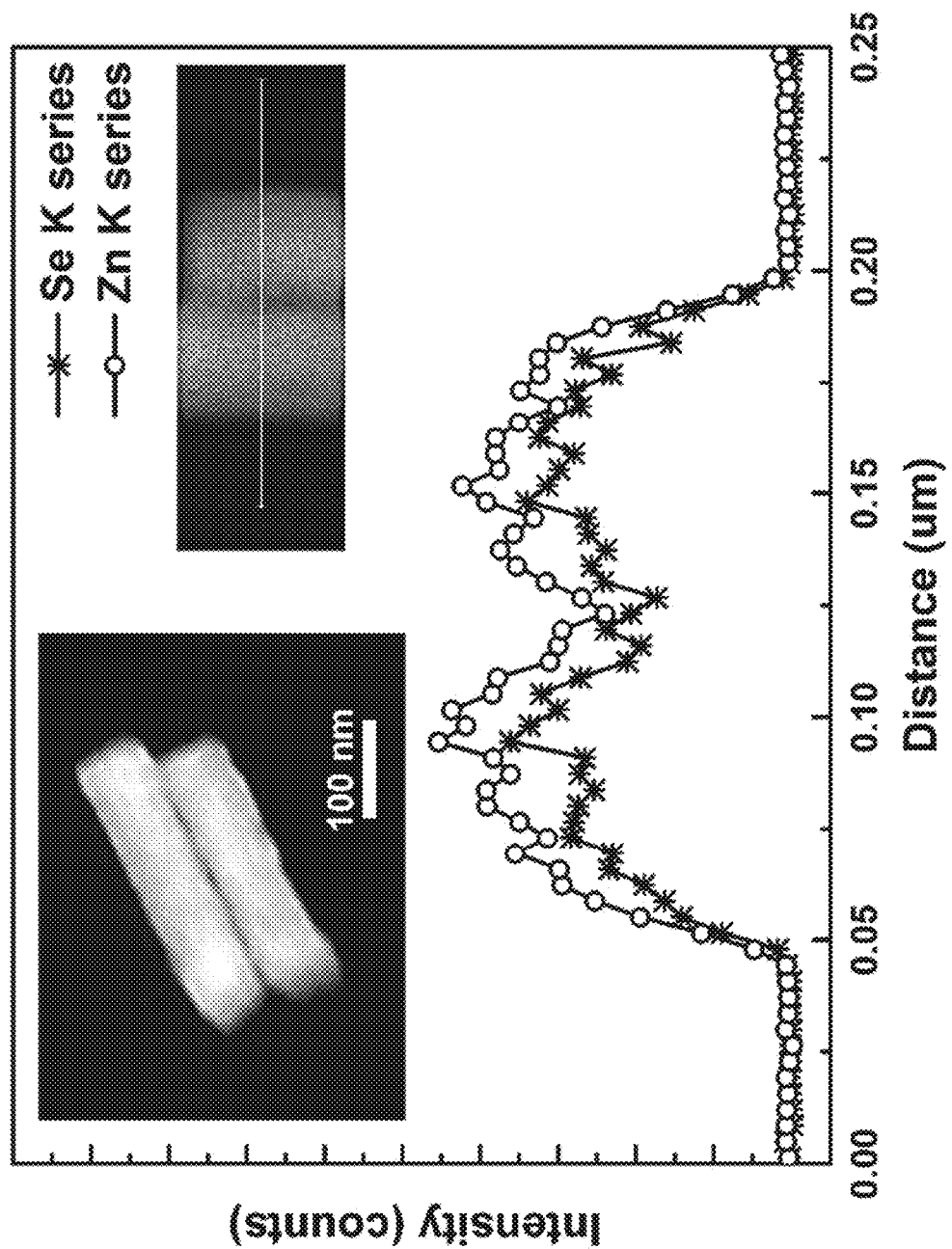
FIG. 14 depicts the scanning transmission electron microscopy (STEM) image and EDX linescan of ZnSe nanoparticles. The ZnSe nanoparticles are rod shape.
Figure 15:
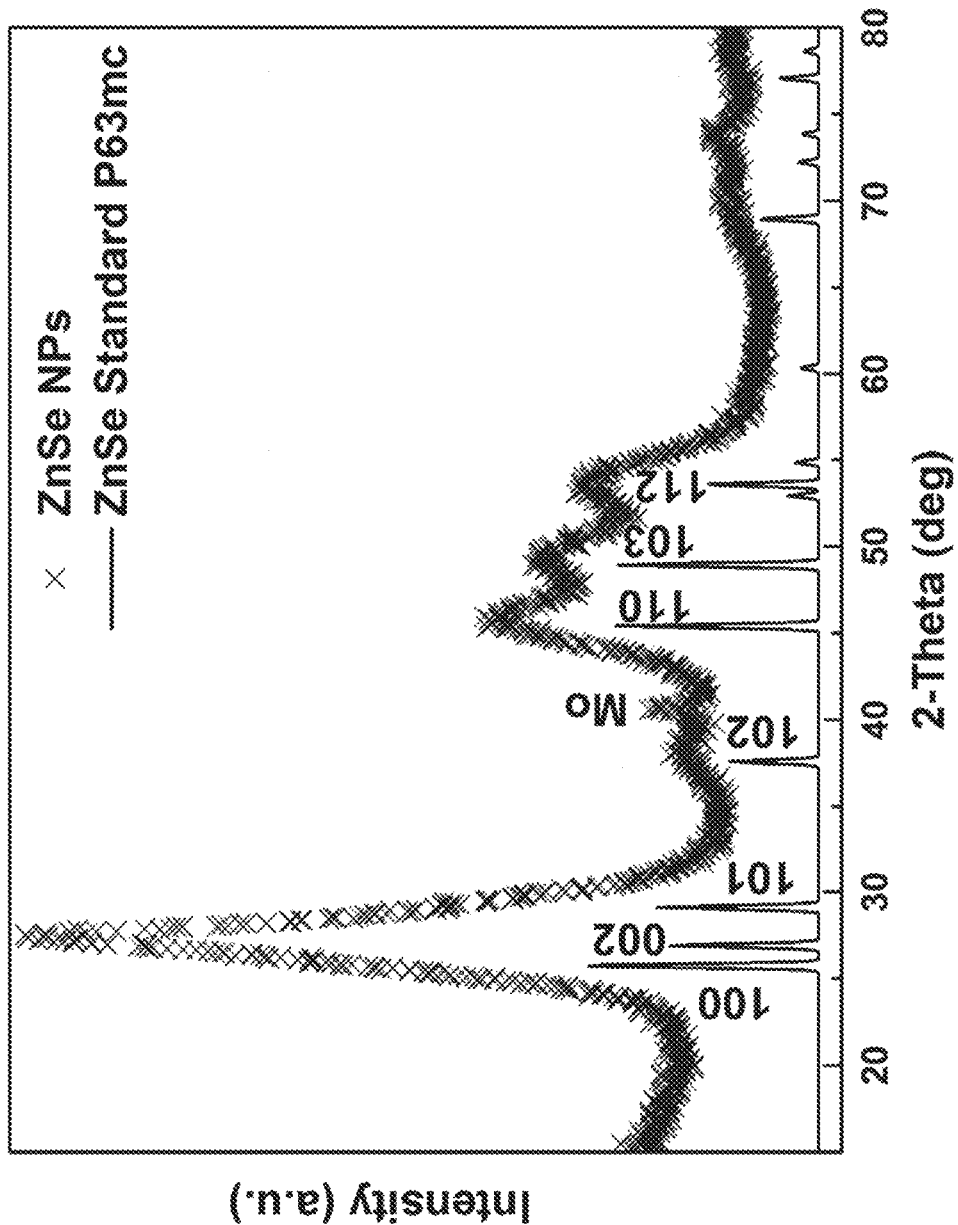
FIG. 15 is X-ray diffraction (XRD) pattern of ZnSe nanoparticles. The pattern matches with the ZnSe wurtzite phase (JCPDS card #01-089-2940).

All operations were performed in a nitrogen-filled glovebox. Solution A is prepared by dissolving 0.163 g Zn metal in 5 ml of ethylenediamine and propanethiol (vol ratio 1:1). Bubbles formed on the Zn powder after heating at 60° C. for 30 sec, indicating gas was generated during the dissolution of the zinc powder. Solution B is prepared by dissolving 0.197 g Se powder in 5 ml ethylenediamine and propanethiol (vol ratio 1:1). After 24 hrs of magnetic stirring, solution A is colorless transparent while solution B is dark red and transparent. The nanoparticles were made by adding solution B into solution A drop-by-drop under vigorous stirring at room temperature. The nanoparticles formed are yellow. The nanoparticles were washed three times using the mixture of butylamine and propanethiol, then washed three times with hexane. FIG. 14 shows that the ZnSe nanoparticles have rod-shaped morphologies. The STEM-EDX linescan (i.e. EDX linescan under scanning transmission electron microscope) indicates that zinc and selenium uniformly distribute in these rods. XRD pattern in FIG. 15 shows that the ZnSe nanoparticles fabricated are wurtzite phase (JCPDS card #01-089-2940).

Embodiments

In one embodiment, a method of dissolving at least one metal source by contacting elemental metal(s), metal salt(s), and/or organometallic complex(es) with the mixture of amine and thiol is presented. The amine can be a primary, secondary, tertiary amine, and/or polyamine, and the carbon chain can range from C2 to C24, while the thiol can have the structure of R5-SH and/or HS-R6-SH, with the carbon chain ranging in size from C2 to C16, wherein R5 represents any alkyl, aryl group, alcohol group —R'OH (R'=alkyl), and/or carboxylic acid group —R"COOH (R"=alkyl and/or aryl), whereas R6 represents any alkyl and/or aryl group.

In another embodiment, a method of dissolving metal source(s) is disclosed. The method includes the steps of contacting the metal alloy(s) with the mixture of amine and thiol. The amine can include a primary, secondary, tertiary amine, and/or polyamine, the amine carbon chain ranges from C2 to C24, while the thiol can have the structure of R5-SH and/or HS-R6-SH, with the carbon chain ranging in size from C2 to C16. R5 represents any alkyl, aryl group, alcohol group —R'OH (R'=alkyl), and/or carboxylic acid group —R"COOH (R"=alkyl and/or aryl). R6 represents any alkyl and/or aryl group.

In yet another embodiment a method of dissolving metal chalcogenide(s) is presented. The method includes contacting metal chalcogenide(s) with the mixture of amine and dithiol. The amine can be a primary, secondary, tertiary amine, and/or polyamine, the amine carbon chain ranges from C2 to C24, while the dithiol has the structure of HS-R6-SH, wherein R6 represents an alkyl and/or aryl group.

In another embodiment, a method of dissolving copper (I) sulfide ($Cu_2S$), copper (II) sulfide (CuS), copper (I) selenide ($Cu_2Se$), and/or copper (II) selenide (CuSe) is disclosed. The method includes the step of contacting $Cu_2S$, CuS, $Cu_2Se$ and/or CuSe with the mixture of amine and dithiol. The amine can be a primary, secondary, tertiary amine, diamine, and/or triamine, the amine carbon chain ranges from C2 to C24, and the thiol has the structure of HS-R6-SH, wherein R6 represents an alkyl and/or aryl group.

In yet another embodiment, a method of dissolving tin (II) sulfide (SnS) is disclosed. This method includes the step of contacting SnS with the mixture of amine and dithiol. The amine can be a primary, secondary, tertiary amine, diamine, triamine, the amine carbon chain ranges from C2 to C24, and the thiol has the structure of HS-R6-SH, wherein R6 represents any alkyl and/or aryl group.

In yet another embodiment, a method of preparing a metal chalcogenide precursor is disclosed. The method includes the step of contacting at least one of elemental metals, metal alloys, metal salts, and organometallic complexes, and at least one of chalcogens with the mixture of amine and thiol. The amine can be a primary, secondary, tertiary amine, and/or polyamine, and the amine carbon chain ranges from C2 to C24, and the thiol has the structure of R5-SH and HS-R6-SH with a carbon chain ranging in size from C2 to C16. R5 represents an alkyl, aryl group, alcohol group —R'OH (R'=alkyl), and/or carboxylic acid group —R"COOH (R"=alkyl and/or aryl). R6 represents an alkyl and/or aryl group.

In yet another embodiment, a method of preparing a metal chalcogenide precursor is disclosed. The method includes the step of simultaneously dissolving at least one of metal sources among elemental metals, metal alloys, metal salts, and organometallic complexes, and at least one of chalcogens in the mixture of amine and thiol. The amine can be a primary, secondary, tertiary amine, and/or polyamine, and the amine carbon chain ranges from C2 to C24, and the thiol has the structure of R5-SH and HS-R6-SH with a carbon chain ranging in size from C2 to C16. R5 represents an alkyl, aryl group, alcohol group —R'OH (R'=alkyl), and/or carboxylic acid group —R"COOH (R"=alkyl and/or aryl). R6 represents an alkyl and/or aryl group.

In yet another embodiment, a method of preparing a metal chalcogenide precursor by separately dissolving at least one metal source and at least one chalcogen is disclosed. This method includes the steps of dissolving at least one of metal sources including elemental metals, metal alloys, metal salts, and organometallic complexes in the mixture of amine and thiol to form a solution A, dissolving at least one of the chalcogens in the mixture of amine and thiol to form a solution B, and combining solution A and solution B at sufficient conditions to form a metal chalcogenide precursor. The amine can be a primary, secondary, tertiary amine, and/or polyamine and the amine carbon chain ranges from C2 to C24, and the thiol has the structure of R5-SH and HS-R6-SH with a carbon chain ranging in size from C2 to C16. R5 represents any alkyl, aryl group, alcohol group —R'OH (R'=alkyl), and/or carboxylic acid group —R"COOH (R"=alkyl and/or aryl). R6 represents any alkyl and/or aryl group.

In yet another embodiment, a method of preparing a metal chalcogenide precursor is disclosed. This method includes the step of stepwise contacting a mixture of amine and thiol with at least one of metal sources, including elemental metals, metal alloys, metal salts, and organometallic complexes and at least one of S and Se. The amine can be a primary, secondary, tertiary amine, and/or polyamine and the amine carbon chain ranges from C2 to C24, while the thiol can have the structure of R5-SH and HS-R6-SH with a carbon chain ranging in size from C2 to C16. R5 represents an alkyl, aryl group, alcohol group —R'OH (R'=alkyl), and/or carboxylic acid group —R"COOH (R"=alkyl and/or aryl). R6 represents an alkyl and/or aryl group.

In yet another embodiment, a method of preparing a metal chalcogenide precursor by mixing the metal chalcogenide solutions is described. In one aspect, the mixture of amine and thiol contains at least one type of amine and at least one type of thiol.

In yet another embodiment, a method of forming solid-phase materials from the precursor(s) is disclosed.

In yet another embodiment, a method of forming solid-phase metal chalcogenides from the precursor(s) is disclosed.

In yet another embodiment, a method of synthesizing nanoparticles from the precursor(s) is disclosed.

In yet another embodiment, a method of synthesizing metal chalcogenide nanoparticles from the precursor(s) is described.

In another embodiment, a method of preparing a nanoparticle ink is described. The nanoparticle ink is composed of one or more types of nanoparticles and one or more types of solutions described herein. The nanoparticle ink can be prepared by combining nanoparticles with the solution(s) described herein.

In yet another embodiment, a method of preparing a nanoparticle ink is described. The nanoparticle ink is composed of one or more types of nanoparticles and one or more types of solutions described herein, further comprising preparing the nanoparticle ink by in-situ forming the nanoparticles from the solution(s) described herein.

As yet another embodiment, a method of preparing a metal chalcogenide nanoparticle ink is described herein. The nanoparticle ink is composed of one or more types of nanoparticles and one or more types of solutions described herein, further including preparing the nanoparticle ink by combining nanoparticles with the solution(s) described herein.

In yet another embodiment, a method of preparing a metal chalcogenide nanoparticle ink is described. The nanoparticle ink is composed of one or more types of nanoparticles and one or more types of solutions described herein, further including preparing the nanoparticle ink by in-situ forming the nanoparticles from the solution(s) described herein.

In yet another embodiment, a method of depositing a thin film on a substrate with the precursor(s) or the nanoparticle ink(s) described herein is disclosed. The deposition of the thin film includes the steps of preparing the precursor(s) as described herein, or preparing the nanoparticle ink(s) as described herein, applying the above precursor(s) or nanoparticle ink(s) on a substrate using a certain technique, and performing proper heat treatment under a suitable condition to form a thin film.

In yet another embodiment, a method of depositing a metal chalcogenide thin film on a substrate with the metal chalcogenide precursor(s) or the nanoparticle ink(s) is described. The deposition of the thin film includes the steps of preparing the precursor(s) as described herein or preparing the nanoparticle ink(s) as described herein, applying the above precursor(s) or nanoparticle ink(s) on a substrate using a certain technique, and performing proper heat treatment under a suitable condition to form a metal chalcogenide thin film. The thin films deposited can be a thin film with compositional and morphological homogeneity, a thin film with compositional uniformity and hierarchical structure, a thin film with compositional gradient and morphological homogeneity, and/or a thin film with both compositional gradient and hierarchical structure.

In yet another embodiment, a method of infiltrating the solutions described herein into thin films composed of nanoparticles is disclosed.

In yet another embodiment, a method of infiltrating metal containing solutions into a porous structure is disclosed. The method includes the steps of providing a porous structure, contacting the porous structure with solution(s) described herein, allowing the metal containing solutions to infiltrate the porous structure, and converting the solutions into a solid phase material by evaporating the solvent(s).

In yet another embodiment, a method of infiltrating the metal chalcogenide precursors into a porous structure is disclosed. The method includes the steps of providing a porous structure, contacting the porous structure with solution(s) described herein, allowing the metal containing solutions to infiltrate the porous structure, and converting the solutions into a solid phase material by evaporating the solvent(s).

In yet another embodiment, a method of using the solution(s) described herein to treat the surface of a metal chalcogenide thin film is disclosed. The method includes the steps of providing a metal chalcogenide thin film and contacting the surface of the metal chalcogenide thin film with the precursor(s) described herein with or without heat treatment in order to modify the surface structure, composition, and/or morphology of the surface.

In yet another embodiment, a method of fabricating the devices using the metal chalcogenide precursors described herein, the nanoparticles described herein, the nanoparticle inks described herein, and/or thin films described herein is disclosed. The devices can include photovoltaic devices, optical devices, transistors, and/or other non-listed semiconducting devices.

In yet another embodiment, a method of depositing a Cu2ZnSn(S,Se)$_4$ film containing a compound formula Cu$_{2-x}$Zn$_{1+y}$Sn(S$_{1-z}$Se$_z$)$_{4+q}$ is described, wherein $0 \leq x \leq 1$, $0 \leq y \leq 1$, $0 \leq z \leq 1$; $-1 \leq q \leq 1$. The preparation of the solution includes the step of dissolving a source of Cu, a source of Zn, a source of Sn in an amine-thiol mixture to form solution A, dissolving a source of at least one of S and Se in an amine-thiol mixture to form solution B, combining solution A and solution B at sufficient conditions to form a stable precursor, applying the above precursor on a substrate with certain techniques to form a Cu$_{2-x}$Zn$_{1+y}$Sn(S$_{1-z}$Se$_z$)$_{4+q}$ thin film, performing proper drying processes and heat treatment, and fabricating photovoltaic devices using the resulting thin film. The amine can be a primary, secondary, tertiary amine, and/or polyamine, and the amine carbon chain ranges from C2 to C24, and the thiol can have the structure of R5-SH and/or HS-R6-SH, with a carbon chain ranging in size from C2 to C16. R5 represents any alkyl, aryl group, alcohol group —R'OH (R'=alkyl), and/or carboxylic acid group —R"COOH (R"=alkyl and/or aryl). R6 represents any alkyl and/or aryl group.

In yet another embodiment, a method of depositing a CuIn$_{1-y}$Ga$_y$(S,Se)$_2$ film containing a compound formula Cu$_x$(In$_{1-y}$Ga$_y$)(S$_{1-z}$Se$_z$)$_{2+q}$, wherein $0 \leq x \leq 1$, $0 \leq y \leq 1$, $0 \leq z \leq 1$; $-1 \leq q \leq 1$ is described. The preparation of the solution includes the steps of dissolving a source of Cu, a source of In, a source of Ga in an amine-thiol mixture to form solution A, dissolving a source of at least one of S and Se in an amine-thiol mixture to form solution B, combining solution A and solution B at sufficient conditions to form stable precursor, applying the above precursor on a substrate with certain technique(s) to form a Cu$_x$(In$_{1-y}$Ga$_y$)(S$_{1-z}$Se$_z$)$_{2+q}$ thin film, performing proper drying processes and heat treatment, and fabricating photovoltaic devices using the resulting thin film. The amine can be a primary, secondary, tertiary amine, and/or polyamine, and the amine carbon chain ranges from C2 to C24, and the thiol has the structure of R5-SH and/or HS-R6-SH, with a carbon chain ranging in size from C2 to C16. R5 represents any alkyl, aryl group, alcohol group —R'OH (R'=alkyl), and/or carboxylic acid group —R"COOH (R"=alkyl and/or aryl). R6 represents any alkyl and/or aryl group.

In yet another embodiment, the herein described methods can be used to apply the precursor onto a substrate and can include at least one of spin coating, doctor blading, inkjet printing, dip coating, curtain coating, screen printing, meniscus coating, spray coating (or electrical spray coating), and roll-to-roll printing.

In yet another embodiment, for the herein described methods, the substrate/porous structure can include metals, oxides, silicon and other seminconductors, polymers, a layer of molybdenum, glass, and any combination thereof.

In yet another embodiment, the heat treatment is performed at a temperature of from 10° C. to about 700° C., the heat treatment can be performed in gaseous atmosphere, vacuum, vapor of chalcogen(s) or under chalcogen compound treatment, such as H$_2$S treatment etc.

In yet another embodiment, a method of dissolving metal oxides is disclosed. The method can include the steps of contacting the metal oxides with a mixture of amine and thiol, wherein the metal oxide can be, but is not limited to, copper oxide, zinc oxide, tin oxide, germanium oxide, and indium oxide; in this mixture of amine and thiol, the amine is a primary, secondary, tertiary amine, and/or polyamine, and the amine carbon chain ranges from C2 to C24, and the thiol has the structure of R5-SH or HS-R6-SH, wherein R5 represents an alkane, alkene, alkyne, alcohol, or other non-carboxylic acid functional group that connects to the sulfur of the thiol group; R6 represents an alky and/or aryl.

A method of preparing a metal chalcogenide precursor comprising contacting at least one of metal oxides is described, and at least one of chalcogens with a mixture of amine and thiol. The amine can be a primary, secondary, tertiary amine, and/or polyamine, and the amine carbon chain ranges from C2 to C24, and the thiol should have the structure of R5-SH and HS-R6-SH with a carbon chain ranging in size from C2 to C16. R5 represents an alkyl, aryl group, alcohol group —R'OH (R'=alkyl), and/or carboxylic acid group —R"COOH (R"=alkyl and/or aryl). R6 represents an alkyl and/or aryl group.

In yet another embodiment, a method of depositing a thin film on a substrate with the precursors described herein is disclosed.

In yet another embodiment, a method of infiltrating solutions into a porous structure using the precursors described herein is disclosed.

In yet another embodiment, a method of selectively removing metal source(s), metal chalcogenide(s), or metal oxide(s) is disclosed. The method can include the steps of dissolving the metal source(s), metal chalcogenide(s), or metal oxide(s) in a mixture of amine and thiol. For dissolving the metal sources, including elemental metals, metal salts and organometallic complexes, the amine can be at least one of a primary, secondary, tertiary amine, polyamine (e.g. diamine, triamine), and the amine carbon chain ranges from C2 to C24, and the thiol has the structure of R5-SH and/or HS-R6-SH, with the carbon chain ranging in size from C2 to C16. R5 represents any alkyl, aryl, alcohol (—R'OH), and/or carboxylic acid group (—R"COOH). R6 represents any alkyl and/or aryl group. For dissolving the metal chalcogenides, the amine can be a primary, secondary, tertiary amine, polyamine (e.g. diamine, triamine), and the amine carbon chain ranges from C2 to C24, and the thiol should be dithiol with the structure of HS-R6-SH, wherein R6 represents any alkyl and/or aryl group. For dissolving the metal oxides, the amine can be primary, secondary, tertiary amine, and/or polyamine, and the amine carbon chain ranges from C2 to C24, while the thiol should have the structure of R5-SH or HS-R6-SH, and the size of the carbon chain ranges from C2 to C16. R5 represents an alkyl, aryl, alcohol and/or other non-carboxylic acid functional group. R6 represents an alkyl and/or aryl group.

Those skilled in the art will recognize that numerous modifications can be made to the specific implementations described above. The implementations should not be limited to the particular limitations described. Other implementations may be possible.

The invention claimed is:

1. A method of dissolving copper (I) sulfide (Cu$_2$S), copper (II) sulfide (CuS), copper (I) selenide (Cu$_2$Se), and/or copper (II) selenide (CuSe), comprising contacting Cu$_2$S, CuS, Cu$_2$Se and/or CuSe with a mixture of amine and dithiol to form a homogeneous solution.

2. The method of claim 1, wherein the amine is at least one of a primary, secondary, tertiary amine, diamine, and triamine, and wherein the amine carbon chain ranges from C2 to C24.

3. The method of claim 1, wherein the amine is a primary amine, the amine carbon chain ranges from C2 to C24.

4. The method of claim 1, wherein the dithiol has the structure of HS-R6-SH, and wherein R6 represents at least one of an alkyl and aryl group.

5. A method of dissolving tin (II) sulfide (SnS), comprising contacting SnS with a mixture of amine and dithiol.

6. The method of claim 5, wherein the amine is at least one of a primary, secondary, tertiary amine, diamine, and a triamine, and wherein the amine carbon chain ranges from C2 to C24.

7. The method of claim 5, wherein the amine is a primary amine, and wherein the primary amine's carbon chain ranges from C2 to C24.

8. The method of claim 5, wherein the dithiol has the structure of HS-R6-SH, and R6 represents at least one of any alkyl and any aryl group.

9. A method of dissolving at least one of Cu, Zn, and Sn, comprising contacting an elemental metal Cu, Zn, and/or Sn with a mixture of at least one primary amine and at least one dithiol to form a homogeneous solution.

10. The method of claim 9, wherein the at least one primary amine is a primary amine with carbon chain ranges from C2 to C24.

11. The method of claim 9, wherein the dithiol has the structure of HS-R6-SH, and R6 represents an alkyl and/or aryl group.

12. A method of dissolving metal oxides, comprising contacting a metal oxide with a mixture of amine and thiol to form a homogeneous solution.

13. The method of claim 12, wherein the metal oxide comprises copper oxide, zinc oxide, tin oxide, germanium oxide, and indium oxide; in this mixture of amine and thiol.

14. The method of claim 12, wherein the amine is a primary, secondary, tertiary amine, and/or polyamine, and the amine carbon chain ranges from C2 to C24.

15. The method of claim 12, wherein the thiol has the structure of R5-SH and/or HS-R6-SH; R5 represents an alkane, alkene, alkyne, alcohol, or other non-carboxylic acid functional group that connects to the sulfur of the thiol group, and R6 represents an alky and/or aryl.

* * * * *